(12) United States Patent
Tsuchida

(10) Patent No.: US 10,923,439 B2
(45) Date of Patent: Feb. 16, 2021

(54) CORE SUBSTRATE, MULTI-LAYER WIRING SUBSTRATE, SEMICONDUCTOR PACKAGE, SEMICONDUCTOR MODULE, COPPER-CLAD SUBSTRATE, AND METHOD FOR MANUFACTURING CORE SUBSTRATE

(71) Applicant: TOPPAN PRINTING CO., LTD., Tokyo (JP)

(72) Inventor: Tetsuyuki Tsuchida, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 16/430,267

(22) Filed: Jun. 3, 2019

(65) Prior Publication Data

US 2019/0287930 A1 Sep. 19, 2019
US 2020/0343199 A9 Oct. 29, 2020

Related U.S. Application Data

(63) Continuation of application No. PCT/JP2017/043677, filed on Dec. 5, 2017.

(30) Foreign Application Priority Data

Dec. 7, 2016 (JP) ................................. 2016-237659

(51) Int. Cl.
*H01L 23/15* (2006.01)
*H01L 23/00* (2006.01)
(Continued)

(52) U.S. Cl.
CPC .......... *H01L 23/562* (2013.01); *H01L 21/486* (2013.01); *H01L 21/4857* (2013.01);
(Continued)

(58) Field of Classification Search
CPC ... H01L 23/562; H01L 23/12; H01L 21/4857; H01L 21/486; H01L 23/15;
(Continued)

(56) References Cited

U.S. PATENT DOCUMENTS 5,536,908 A 7/1996 Etchells et al.
2006/0022304 A1* 2/2006 Rzeznik .................. H01G 4/08
257/532
(Continued)

FOREIGN PATENT DOCUMENTS

JP 10056247 * 2/1998
JP H10-56247 A 2/1998
(Continued)

OTHER PUBLICATIONS

Machine translated document (Year: 2009).*
(Continued)

*Primary Examiner* — Ahmed N Sefer
(74) *Attorney, Agent, or Firm* — Foley & Lardner LLP

(57) ABSTRACT

A technique for making a glass core substrate that is less prone to cracking. A core substrate of the present invention includes a glass plate and a first conductor pattern provided on a first main surface of the glass plate. The first conductor pattern includes a first nickel plating layer that is provided (Continued)

on the first main surface of the glass plate and has a phosphorus content of 5 mass % or less and a first copper plating layer that is provided on the first nickel plating layer.

15 Claims, 23 Drawing Sheets

(51) Int. Cl.
    *H01L 21/48* (2006.01)
    *H01L 23/498* (2006.01)
    *H01L 23/64* (2006.01)
    *H05K 1/09* (2006.01)
    *H01L 23/12* (2006.01)
    *H05K 1/16* (2006.01)

(52) U.S. Cl.
    CPC .............. *H01L 23/12* (2013.01); *H01L 23/15* (2013.01); *H01L 23/49822* (2013.01); *H01L 23/49827* (2013.01); *H01L 23/49838* (2013.01); *H01L 23/49866* (2013.01); *H01L 23/642* (2013.01); *H01L 24/16* (2013.01); *H05K 1/09* (2013.01); *H05K 1/16* (2013.01); *H01L 2224/16227* (2013.01); *H01L 2924/19041* (2013.01); *H01L 2924/19103* (2013.01); *H01L 2924/3512* (2013.01)

(58) Field of Classification Search
    CPC ......... H01L 23/49822; H01L 23/49827; H01L 23/49838; H01L 23/49866; H01L 23/642; H01L 24/16; H01L 2224/16227; H01L 2924/19041; H01L 2924/19103; H01L 2924/3512; H01L 23/49816; H01L 23/50; H01L 23/49811; H05K 1/09; H05K 1/16; H05K 3/426; H05K 2201/0341; H05K 3/388; H05K 3/4605
    See application file for complete search history.

(56) References Cited

U.S. PATENT DOCUMENTS

| | | | | |
|---|---|---|---|---|
| 2006/0079050 | A1* | 4/2006 | Cahalen | ................ H05K 1/162 438/250 |
| 2007/0194575 | A1* | 8/2007 | Wu | ......................... F03D 15/00 290/55 |
| 2007/0243404 | A1 | 10/2007 | Lin | |
| 2007/0248747 | A1 | 10/2007 | Lin | |
| 2008/0172852 | A1* | 7/2008 | Borland | .................. H01G 4/33 29/25.42 |
| 2013/0342960 | A1* | 12/2013 | Saita | ....................... H01G 4/01 361/305 |
| 2014/0015121 | A1 | 1/2014 | Koizumi et al. | |
| 2018/0132355 | A1* | 5/2018 | Saita | ...................... H01G 4/005 |

FOREIGN PATENT DOCUMENTS

| | | |
|---|---|---|
| JP | 2000-252630 A | 9/2000 |
| JP | 2003-166974 A | 6/2003 |
| JP | 2005-026670 A | 1/2005 |
| JP | 2008-227177 A | 9/2008 |
| JP | 2009295687 A * | 12/2009 |
| JP | 2014-022465 A | 2/2014 |
| JP | 2016-152397 A | 8/2016 |

OTHER PUBLICATIONS

Extended European Search Report dated Nov. 18, 2019 for corresponding Application No. 17878749.5.
International Searching Authority, "International Search Report," issued in connection with International Patent Application No. PCT/JP2017/043677, dated Mar. 13, 2018.
International Searching Authority, "Written Opinion," issued in connection with International Patent Application No. PCT/JP2017/043677, dated Mar. 13, 2018.
Office Action dated Aug. 11, 2020 for corresponding Japanese Patent Application No. 2016-237659.

* cited by examiner

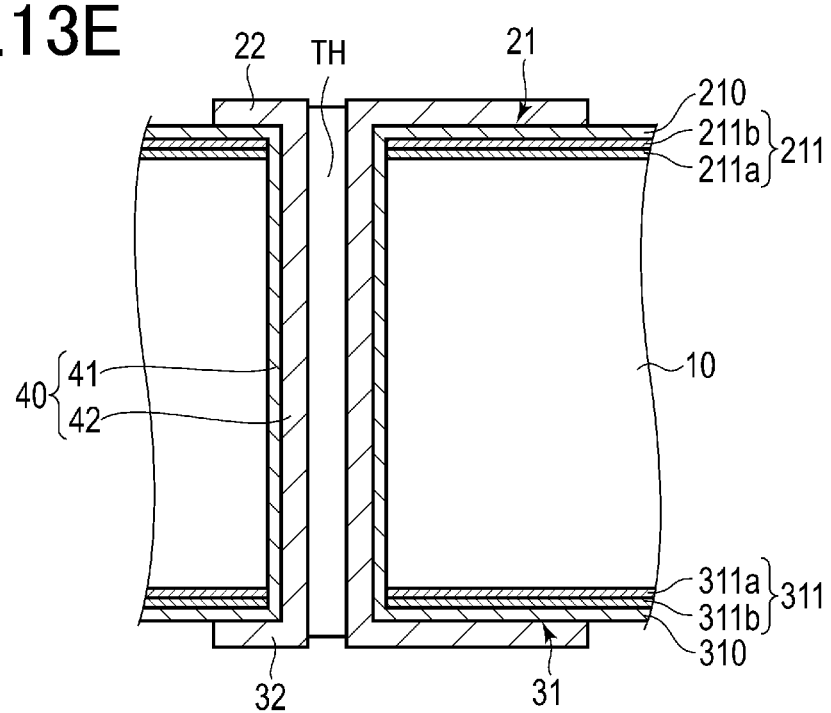
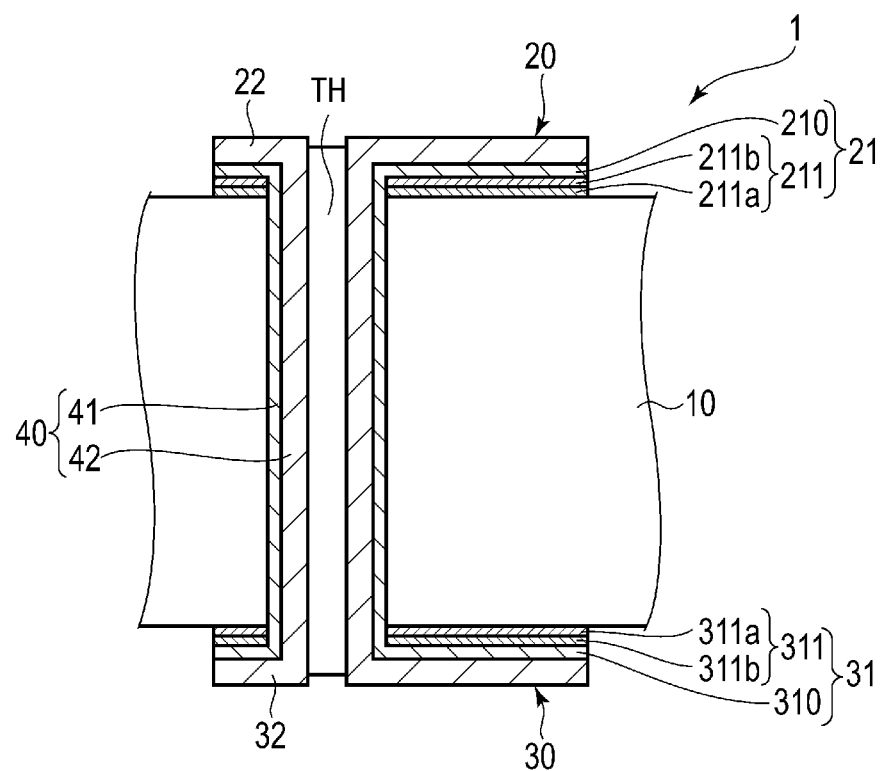

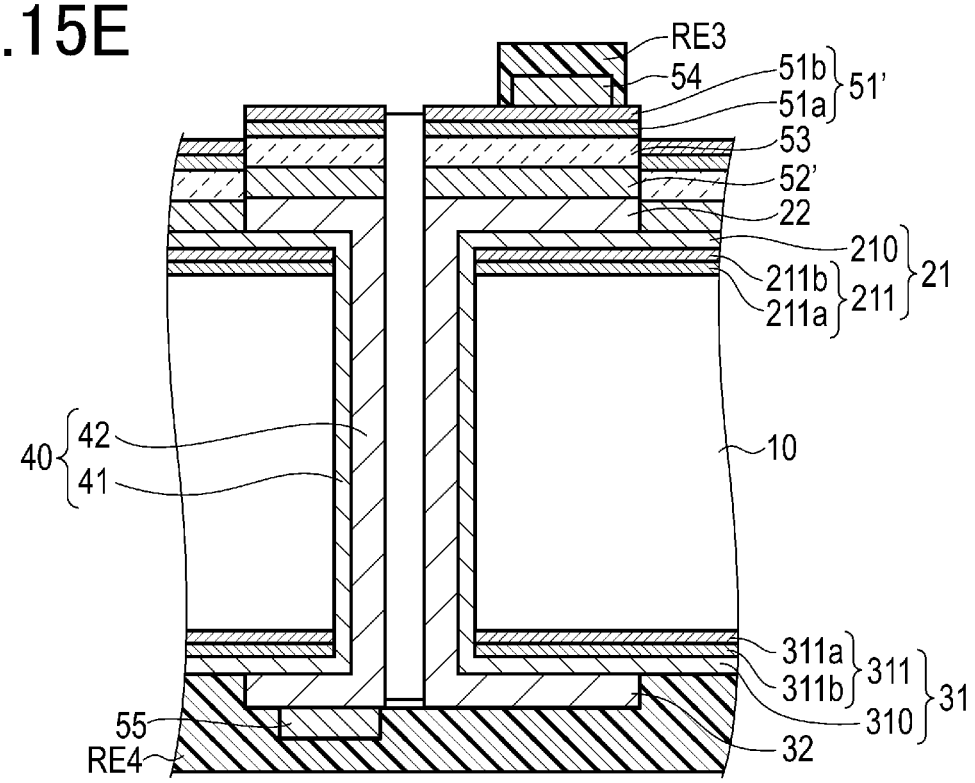
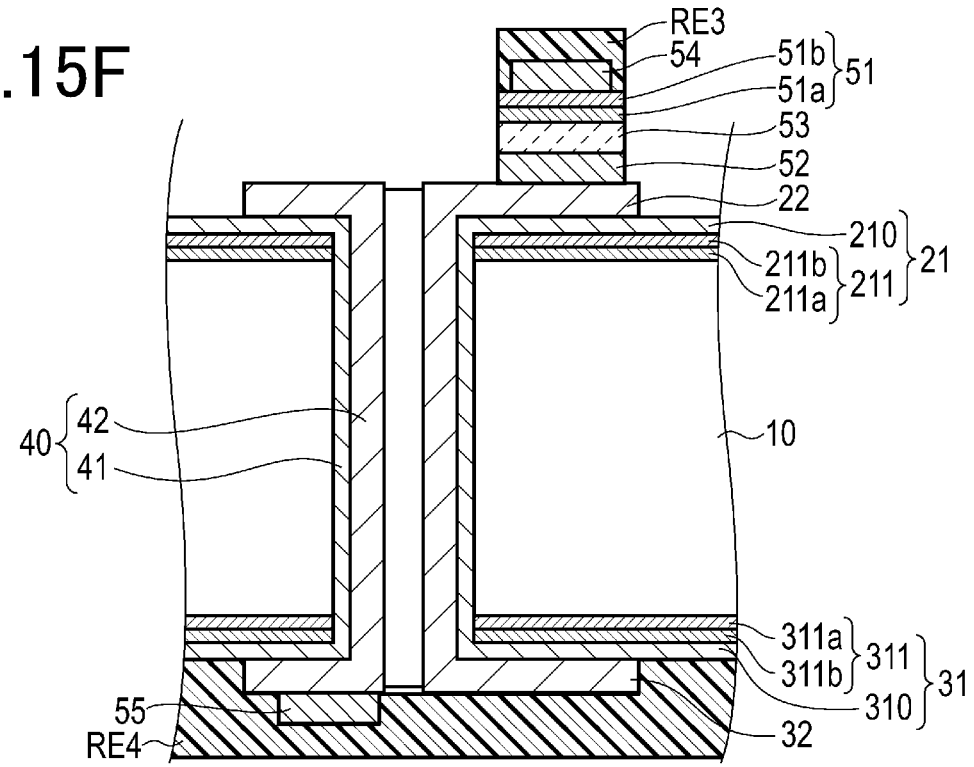

CORE SUBSTRATE, MULTI-LAYER WIRING SUBSTRATE, SEMICONDUCTOR PACKAGE, SEMICONDUCTOR MODULE, COPPER-CLAD SUBSTRATE, AND METHOD FOR MANUFACTURING CORE SUBSTRATE

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2017/043677, filed on Dec. 5, 2017, which is based upon and claims the benefit of priority to Japanese Patent Application No. 2016-237659, filed on Dec. 7, 2016; the disclosures of which are incorporated herein by reference in their entireties.

TECHNICAL FIELD

The present invention relates to a core substrate, a multi-layer wiring substrate, semiconductor package, a semiconductor module, a copper-clad substrate, and a method for manufacturing a core substrate.

BACKGROUND ART

In recent years, electronic devices have been increasingly higher in function and smaller in size. Therefore, there is a demand for densification of semiconductor modules to be mounted in electronic devices. To meet this demand, enhancement of wiring density of wiring substrates on which a semiconductor chip is to be mounted has been studied.

As a core material for the wiring substrate, a glass epoxy resin is generally used (JP 2000-252630 A). In recent years, glass wiring substrates made of a glass plate as a core material have attracted attention.

A glass plate can achieve a higher degree of smoothness than a core material made of a glass epoxy resin. Thus, glass wiring substrates allow ultra-fine wiring. Therefore, the use of a glass wiring substrate allows high-density implementation.

The coefficient of thermal expansion (CTE) of a glass plate in the temperature range of 20° C. to 260° C. almost coincides with the coefficient of thermal expansion of a semiconductor chip made of a silicon substrate in the temperature range of 20° C. to 260° C. Therefore, the use of the glass wiring substrate allows implementation with small residual stress.

Further, the glass wiring substrate is excellent in high-speed transmission.

From the foregoing points, the glass wiring substrate has been attracting attention as one of wiring substrates of semiconductor modules to be mounted in high-performance electronic devices.

SUMMARY OF THE INVENTION

A glass core substrate is a glass wiring substrate or a part thereof. The glass core substrate can be obtained by forming a nickel plating layer on at least a first main surface of a glass plate by electroless plating, forming a copper plating layer covering a portion of the nickel plating layer by electrolytic plating, and etching the other portion of the nickel plating layer, that is, a portion of the nickel plating layer not covered with the copper plating layer, to form a conductor pattern.

However, the glass core substrate obtained by the foregoing method has a problem of susceptibility to cracking.

An object of the present invention is to provide a technique for making a glass core substrate less prone to cracking.

According to a first aspect of the present invention, there is provided a core substrate that includes a glass plate and a first conductor pattern provided on a first main surface of the glass plate. The first conductor pattern includes a first nickel plating layer that is provided on the first main surface of the glass plate and has a phosphorus content of 5 mass % or less and a first copper plating layer that is provided on the first nickel plating layer.

According to a second aspect of the present invention, there is provided a multi-layer wiring substrate that includes the core substrate according to the first aspect, a wiring layer opposed to the glass plate with the first conductor pattern therebetween, and an insulation layer that is disposed between the first conductor pattern and the wiring layer.

According to a third aspect of the present invention, there is provided a semiconductor package that includes the core substrate according to the first aspect or the multi-layer wiring substrate according to the second aspect and a semiconductor chip mounted on the substrate.

According to a fourth aspect of the present invention, there is provided a semiconductor module that includes the semiconductor package according to the third aspect and a mother board on which the semiconductor package is mounted.

According to a fifth aspect of the present invention, there is provided a copper-clad substrate that includes a glass plate, a nickel plating layer provided on a first main surface of the glass plate and having a phosphorus content of 5 mass % or less, and a copper plating layer provided on the nickel plating layer.

According to a sixth aspect, there is provided a method for manufacturing a core substrate including: forming a nickel plating layer with a phosphorus content of 5 mass % or less on at least a first main surface of a glass plate by electroless plating; forming a copper plating layer to cover a portion of the nickel plating layer by electrolytic plating; and etching the other portion of the nickel plating layer by using an acid as an etching agent to form a conductor pattern including the one portion of the nickel plating layer and the copper plating layer.

BRIEF DESCRIPTION OF THE DRAWINGS

FIG. 13E is a schematic cross-sectional view illustrating the example of the method for manufacturing the core substrate illustrated in FIGS. 1 and 2;

FIG. 13F is a schematic cross-sectional view illustrating the example of the method for manufacturing the core substrate illustrated in FIGS. 1 and 2;

FIG. 15E is a schematic cross-sectional view illustrating the example of the method for manufacturing the core substrate illustrated in FIGS. 5 and 6;

FIG. 15F is a schematic cross-sectional view illustrating the example of the method for manufacturing the core substrate illustrated in FIGS. 5 and 6;

DESCRIPTION OF REPRESENTATIVE EMBODIMENTS

Figure 1:
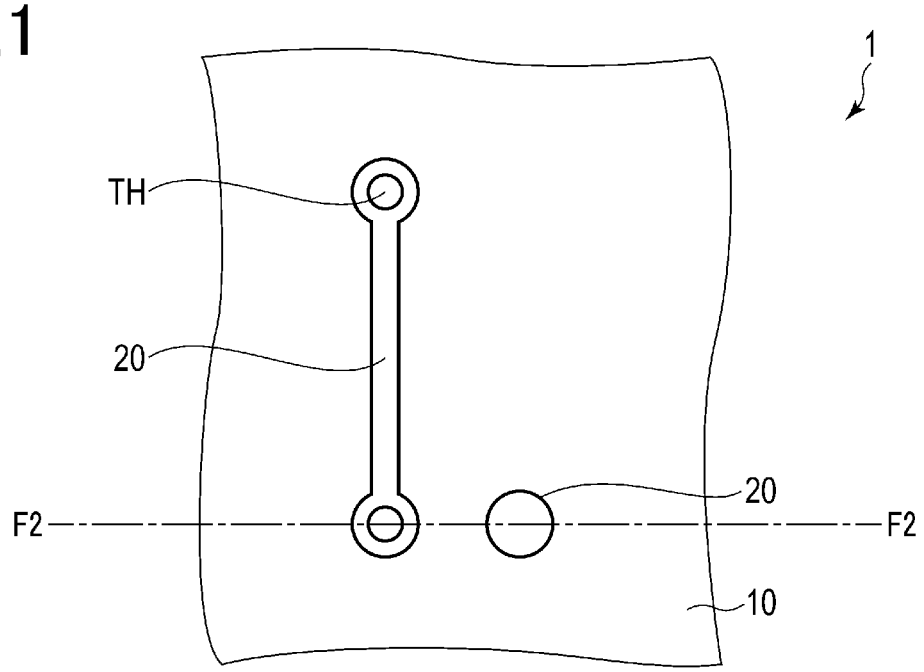
FIG. 1 is a schematic planar view of a core substrate according to an aspect of the present invention.

With reference to the drawings, a description will now be given of representative embodiments according to the present invention. The present invention is not limited to the following representative embodiments, and appropriate modifications can be made without departing from the spirit of the present invention. The representative embodiments described below are merely examples of the present invention, and the design thereof could be appropriately changed by one skilled in the art. Here, the drawings are schematic, and the relationship between thickness and plane size, the ratio of the thickness of each layer, etc., are different from actual ones. The embodiments described below are merely examples of the configurations for embodying the technical idea of the present invention, and the technical idea of the present invention should not limit the materials, shapes, structures, and the like of the components to those described below. The technical idea of the present invention can be modified in various ways within the technical scope specified by the claims.

The same constituent elements are denoted by the same reference numerals unless there is a reason for the sake of convenience, and redundant description is omitted. In the drawings referred to in the following description, for clarity, characteristic parts are enlarged, and thus the components are not shown to scale. It is, however, clear that one or more embodiments can be implemented without such details. In addition, known structures and devices may be schematically represented for simplicity.

The inventors have conducted detailed research into the problem described above. That has revealed that the phosphorus content of a nickel plating layer influences cracking in the core substrate. Specifically, the phosphorus content of a nickel plating layer formed on at least the first main surface of a glass plate is conventionally 6 mass % or more. However, the inventors have discovered that sufficiently decreasing the phosphorus content of a nickel plating layer would make the core substrate less prone to cracking. The present invention is based on this discovery.

Figure 2:
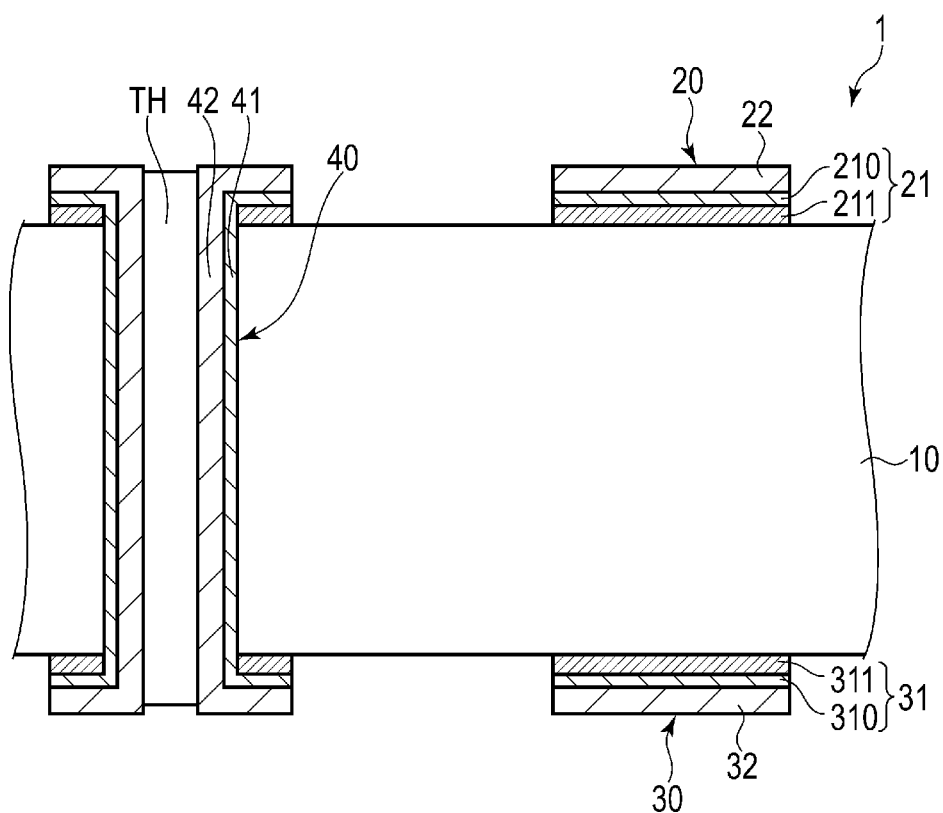
FIG. 2 is a cross-sectional view of the core substrate illustrated in FIG. 1 taken along line F2-F2.

A core substrate 1 illustrated in FIGS. 1 and 2 includes a glass plate 10 with a through hole TH, a first conductor pattern 20, a second conductor pattern 30, and a conductor layer 40.

The glass plate 10 typically has light permeability. There are no particular limitations on the components and their ratios of a glass material for the glass plate 10. The glass plate 10 can be made from glass having silicate as the main component such as alkali-free glass, alkali glass, borosilicate glass, quartz glass, sapphire glass, or light-sensitive glass, for example. From the viewpoint of being used for a semiconductor package and a semiconductor module, the glass plate 10 is desirably made from alkali-free glass. The alkali component content of the alkali-free glass is preferably 0.1 mass % or less.

The thickness of the glass plate 10 is preferably 1 mm or less. The thickness of the glass plate 10 is more preferably in the range of 0.1 mm or more and 0.8 mm or less in consideration of the ease of forming the through hole TH and the handleability at the time of manufacture.

Examples of a method for manufacturing the glass plate 10 include a float method, a down-draw method, a fusion method, an up-draw method, and a roll-out method. The glass plate 10 may be produced by any of the foregoing methods.

The coefficient of thermal expansion (CTE) of the glass plate 10 is preferably in the range of $0.1 \times 10^{-6}$/K or more and $15.0 \times 10^{-6}$/K or less in the temperature range of 20° C. to 260° C., more preferably in the range of $0.5 \times 10^{-6}$/K or more and $8.0 \times 10^{-6}$/K or less, and further preferably in the range of $0.5 \times 10^{-6}$/K or more and $4.0 \times 10^{-6}$/K or less. When the coefficient of thermal expansion of the glass plate 10 is in this range, the difference from the coefficient of thermal expansion of a semiconductor chip using a silicon substrate to be mounted on the surface of the core substrate 1 tends to be small. The coefficient of thermal expansion refers to the ratio of change in length corresponding to temperature rise.

At least the first main surface of the glass plate 10 may include a functional layer. Examples of the functional layer include an antireflection layer containing fine particles, an infrared shielding layer containing an infrared absorbing agent, a strength imparting layer containing a hard coat material, an antistatic layer containing an antistatic agent, a color layer containing a coloring agent, an optical filter layer containing an optical thin film, a texture control layer and an antiglare layer containing a light scattering film. These functional layers can be formed by surface treatment techniques such as evaporation, sputtering, or wet-spraying, for example.

The shape of a cross section of the through hole TH with respect to the length direction may be a rectangle, an X shape in which the diameter of the center of the through hole TH is smaller than the top diameter and the bottom diameter, a tapered shape in which the bottom diameter of the through hole TH is smaller than the top diameter, an 0 shape in which the diameter of the center of the through hole TH is larger than the top diameter and the bottom diameter, or any other shape.

The shape of a cross section of the through hole TH vertical to the length direction may be a circle, an oval, or a polygon.

The first conductor pattern 20 is provided on the first main surface of the glass plate 10. The first conductor pattern 20 constitutes a circuit wiring or an electrode pad, for example.

The first conductor pattern 20 includes a first seed layer 21 and a first copper plating layer 22. The first seed layer 21 is provided on the glass plate 10. The first copper plating layer 22 is provided on the first seed layer 21.

The first seed layer 21 includes a first metal-containing layer 211 and a first nickel plating layer 210. The first metal-containing layer 211 is provided on the glass plate 10. The first nickel plating layer 210 is provided on the first metal-containing layer 211.

The second conductor pattern 30 is provided on a second main surface of the glass plate 10. The second conductor pattern 30 constitutes a circuit wiring or an electrode pad, for example.

The second conductor pattern 30 includes a second seed layer 31 and a second copper plating layer 32. The second seed layer 31 is provided on the glass plate 10. The second copper plating layer 32 is provided on the second seed layer 31.

The second seed layer 31 includes a second metal-containing layer 311 and a second nickel plating layer 310. The second metal-containing layer 311 is provided on the glass plate 10. The second nickel plating layer 310 is provided on the second metal-containing layer 311.

The first copper plating layer 22, the first nickel plating layer 210, the first metal-containing layer 211, the second copper plating layer 32, the second nickel plating layer 310, and the second metal-containing layer 311 will be described later in detail.

The conductor layer 40 covers the side wall of the through hole TH. The conductor layer 40 electrically connects at least a portion of the first conductor pattern 20 and at least a portion of the second conductor pattern 30. The conductor layer 40 includes a third seed layer 41 and a third copper plating layer 42.

The third seed layer 41 includes a third nickel plating layer. The third seed layer 41 is typically formed from the third nickel plating layer. The third seed layer 41 is in contact with the side wall of the through hole TH. The third copper plating layer 42 is provided on the third seed layer 41.

The composition and other properties of the third nickel plating layer are similar to the compositions and other properties of the first nickel plating layer 210 and the second nickel plating layer 310 described later. The composition and other properties of the third copper plating layer 42 are similar to the compositions and other properties of the first copper plating layer 22 and the second copper plating layer 32 described later.

The first nickel plating layer 210 and the second nickel plating layer 310 contain phosphorus (P). The phosphorus contents of the nickel plating layers 210 and 310 are 5 mass % or less, preferably 3 mass % or less, more preferably 1 mass % or less.

When the phosphorus contents of the nickel plating layers 210 and 310 are sufficiently small, the core substrate 1 is less prone to cracking. Although there is no particular lower limit value of the phosphorus content, the phosphorus content is 0.1 mass % or more in one example, 0.5 mass % or more in another example, and 1 mass % or more in still another example.

The phosphorus contents of the nickel plating layers 210 and 310 can be obtained by energy-dispersive X-ray analysis (EDX), for example.

The nickel plating layers 210 and 310 may contain other components such as sulfur (S), lead (Pb), and bismuth (Bi) in addition to nickel and phosphorus. The ratios of other components included in the nickel plating layers 210 and 310 are preferably 2000 ppm or less.

The sulfur content of a nickel plating layer can be determined by the following method, for example.

First, a nickel plating layer is formed on a stainless steel plate by electroless plating. Then, the nickel plating layer is stripped from the stainless steel plate. Then, the sulfur content of this nickel plating layer can be determined by the method (combustion-coulometric method) described in JP 2003-166974 A.

The lead and bismuth contents of a nickel plating layer can be obtained by the following method, for example.

First, a nickel plating layer is formed on a stainless steel plate by electroless plating. Then, the nickel plating layer is stripped from the stainless steel plate. Then, the lead and bismuth contents of the nickel plating layer can be determined by ICP mass spectrometry.

The thicknesses of the nickel plating layers 210 and 310 are desirably 1 μm or less, more desirably 0.4 μm or less, further desirably 0.3 μm or less.

When the third nickel plating layer 41 is thin, the adhesion between the glass plate 10 and the third nickel plating layer 41 tends to be high. When the third nickel plating layer 41, the first nickel plating layer 210, and the second nickel plating layer 310 are thin, the time required for formation of these plating layers and the time required for etching the first nickel plating layer 210 and the second nickel plating layer 310 are short to facilitate manufacture.

The thicknesses of the nickel plating layers 210, 310, and 41 are preferably 0.01 μm or more, and more preferably 0.05 μm or more. When the third nickel plating layer 41 is thinner than 0.01 the electrolytic copper plating layer 42 may become discontinuous in the through hole TH.

The thicknesses of the nickel plating layers 210 and 310 can be obtained by X-ray fluorescence elemental analysis, for example.

The first metal-containing layer 211 and the second metal-containing layer 311 improve respectively the adhesion between the glass plate 10 and the first nickel plating layer 210 and the adhesion between the glass plate 10 and the second nickel plating layer 310. The metal-containing layers 211 and 311 are typically formed by sputtering or chemical vapor deposition (CVD).

The metal-containing layers 211 and 311 are formed from, for example, copper (Cu), aluminum (Al), titanium (Ti), chromium (Cr), molybdenum (Mo), tungsten (W), tantalum (Ta), gold (Au), iridium (Ir), ruthenium (Ru), palladium (Pd), platinum (Pt), Al—Si alloy, Al—Si—Cu alloy, Al—Cu alloy, Ni—Fe alloy, indium tin oxide (ITO), indium zinc oxide (IZO), active zinc oxide (AZO), zinc oxide (ZnO), lead zirconate titanate (PZT), titanium nitride (TiN), $Cu_3N_4$, Cu alloy, or a mixture of them.

The metal-containing layers 211 and 311 may be single layers or two or more layers. The thicknesses of the metal-containing layers 211 and 311 desirably are in the range of 0.01 μm or more and 1 μm or less, and more preferably in the range of 0.1 μm or more and 0.6 μm or less. When the thicknesses of the metal-containing layers 211 and 311 fall within this range, it is possible to improve the adhesion between the first nickel plating layer 210 and the glass plate 10, the adhesion between the second nickel plating layer 310 and the glass plate 10, and shorten the processing time.

Each of the metal-containing layers 211 and 311 preferably contains a titanium layer. The titanium layer is excellent in adhesion with the glass plate 10. The thickness of the titanium layer is preferably in the range of 0.01 μm or more and 0.1 μm or less.

Each of the metal-containing layers 211 and 311 preferably contains a copper layer. The copper layer is excellent in adhesion with the first nickel plating layer 210 and the second nickel plating layer 310. The thickness of the copper layer is preferably in the range of 0.09 μm or more and 0.5 μm or less.

Each of the metal-containing layers 211 and 311 preferably contains both a titanium layer and a copper layer. In this case, the titanium layer is preferably disposed between the first nickel plating layer 210 and the glass plate 10 and between the second nickel plating layer 310 and the glass plate 10, and the copper layer is preferably disposed between the titanium layer and the first nickel plating layer 210 and between the titanium layer and the second nickel plating layer 310. Adopting this configuration makes it possible to further improve the adhesion between the glass plate 10 and the first nickel plating layer 210 and the adhesion between the glass plate 10 and the second nickel plating layer 310.

A palladium layer may be formed on the metal-containing layers 211 and 311. Palladium constitutes a catalyst for electroless nickel plating. Therefore, palladium is preferably disposed between the first nickel plating layer 210 and the glass plate and between the second nickel plating layer 310 and the glass plate 10.

An intermetallic compound layer may be formed between the palladium layer and the other metal-containing layer included in the metal-containing layers 211 and 311, and between the palladium layer and the nickel plating layers 210 and 310.

The first copper plating layer 22 and the second copper plating layer 32 can be formed by a publicly known method such as a subtractive method, a semi-additive method, or an additive method.

The thicknesses of the copper plating layers 22 and 32 are preferably in the range of 1 μm to 20 μm, and more preferably in the range of 3 μm to 18 μm.

The copper plating layers 22 and 32 may contain a component other than copper, such as nickel and sulfur. The content percentages of the component other than copper in the copper plating layers 22 and 32 are preferably 1 mass % or less.

The surfaces of the copper plating layers 22 and 32 may be roughened. This improves the adhesion between the first copper plating layer 22 and a first insulation layer 61 described later and the adhesion between the second copper plating layer 32 and a second insulation layer 62 described later.

The core substrate 1 may further include first and second adhesion layers not illustrated. The first adhesion layer is provided on the first main surface of the glass plate 10 at a portion not covered with the first conductor pattern 20. The second adhesion layer is provided on the second main surface of the glass plate 10 at a portion not covered with the second conductor pattern 30. The first adhesion layer improves the adhesion between the glass plate 10 and the first insulation layer 61 described later. The second adhesion layer improves the adhesion between the glass plate 10 and the second insulation layer 62 described later. The first and second adhesion layers typically contain a silane coupling agent.

When the surfaces of the copper plating layers 22 and 32 are not to be roughened, the core substrate 1 may further include third and fourth adhesion layers not illustrated on the surfaces of the copper plating layers 22 and 32. The third adhesion layer is provided on the first copper plating layer 22. The fourth adhesion layer is provided on the second copper plating layer 32. The third adhesion layer improves the adhesion between the first copper plating layer 22 and the first insulation layer 61 described later. The fourth adhesion layer improves the adhesion between the second copper plating layer 32 and the second insulation layer 62 described later. The third and fourth adhesion layers typically include a laminated structure of a layer containing tin (Sn) and a layer containing a silane coupling agent.

The core substrate 1 has been described as including the conductor pattern on the both surfaces of the glass plate 10 as an example. However, the conductor pattern may be formed on at least the first main surface of the glass plate.

The third seed layer 41 has been described as including a single-layer structure formed from only the third nickel plating layer as an example. However, the third seed layer 41 may be formed from two or more layers. The third seed layer 41 may include a third metal-containing layer that is disposed between the third nickel plating layer and the glass plate 10, for example. The composition and other properties of the third metal-containing layer are typically similar to the compositions and other properties of the metal-containing layers 211 and 311, for example.

Figure 3:
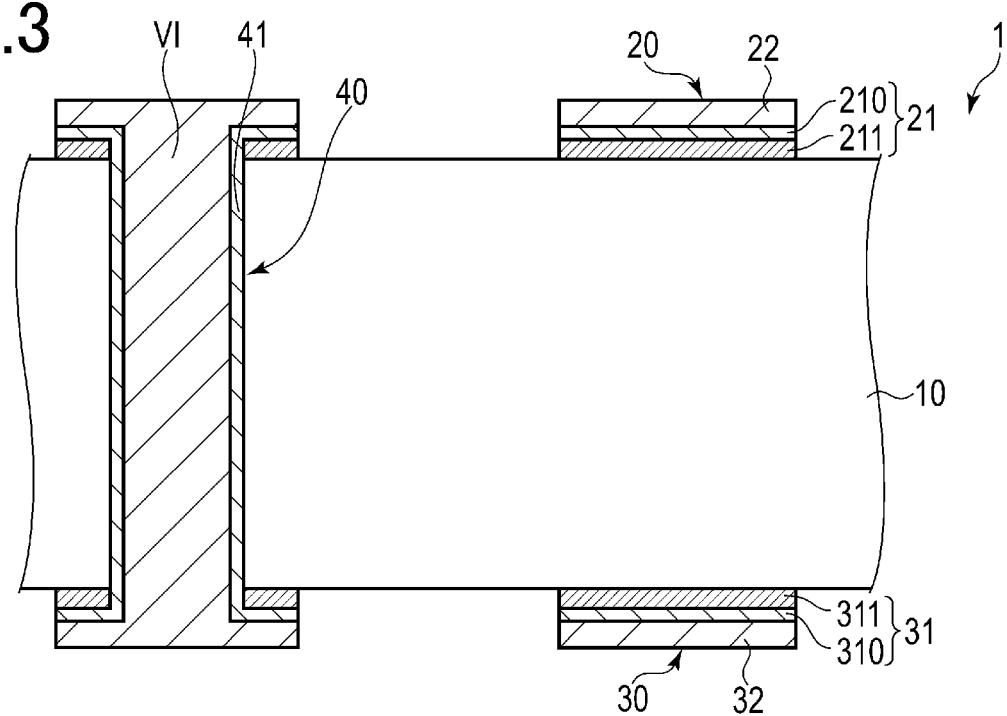
FIG. 3 is a schematic cross-sectional view of a first modification example of the core substrate illustrated in FIGS. 1 and 2.

FIG. 3 is a schematic cross-sectional view of a first modification example of the core substrate illustrated in FIGS. 1 and 2. The core substrate 1 further includes a via VI made of copper. The via VI is formed by filling the through hole TH together with the conductor layer 40 with copper. The composition and other properties of the copper are typically similar to the compositions and other properties of the copper plating layers 22 and 32 described above. An example of a method for forming the via VI is electrolytic plating.

Figure 4:
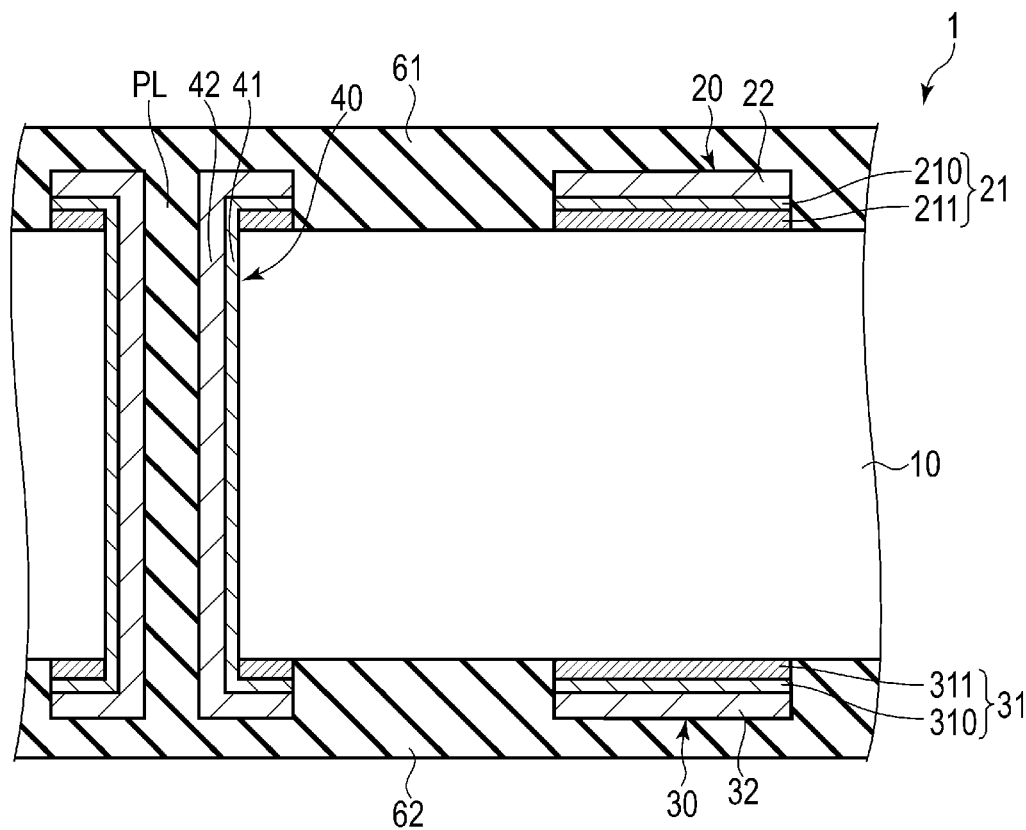
FIG. 4 is a schematic cross-sectional view of a second modification example of the core substrate illustrated in FIGS. 1 and 2.

FIG. 4 is a schematic cross-sectional view of a second modification example of the core substrate illustrated in FIGS. 1 and 2. The core substrate 1 further includes a plug PL made of resin, the first insulation layer 61, and the second insulation layer 62.

The plug PL is formed by filling the through hole TH together with the conductor layer 40 with a resin. The insulation layers 61 and 62 cover respectively the first main surface and the second main surface of the core substrate 1. The plug PL, the first insulation layer 61, and the second insulation layer 62 are typically formed from the same resin in an integrated manner.

The resin may be any of an epoxy resin, a polyimide resin, a maleimide resin, polyethylene terephthalate, polyphenylene oxide, liquid crystal polymer, and a composite material of them. The resin is desirably an epoxy resin containing a filler from the viewpoints of electrical characteristics and the ease of manufacture. The filler can be silica, barium sulfate, titanic oxide, or a mixture of them, for example. The resin may be a conductive paste or a conductive resin.

Figure 5:
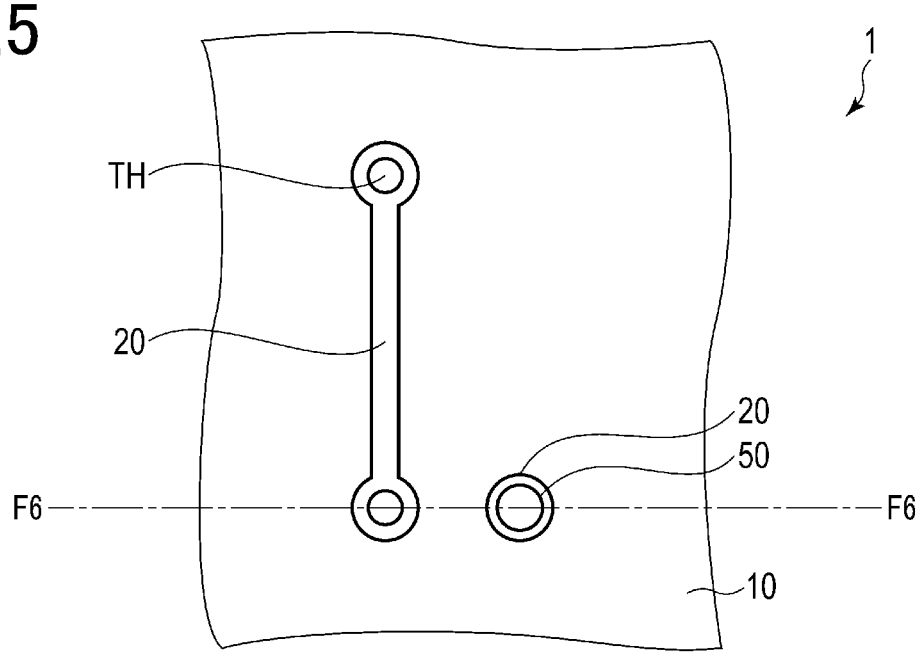
FIG. 5 is a schematic planar view of a core substrate according to another aspect of the present invention.
Figure 6:
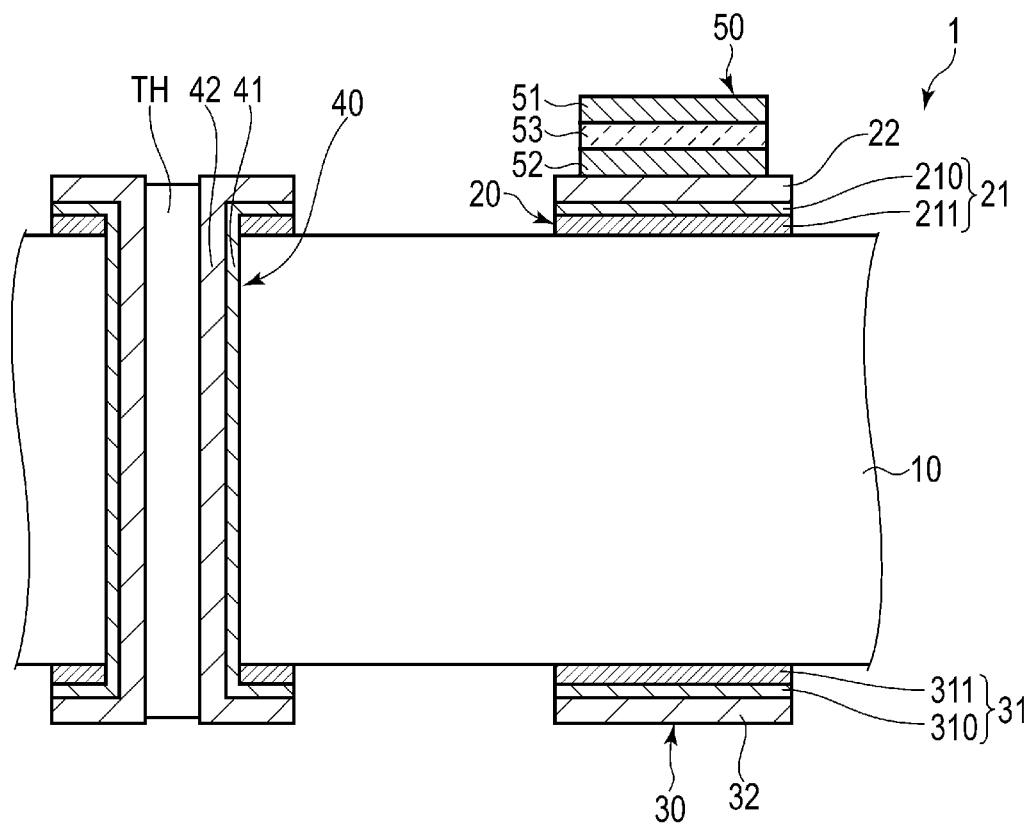
FIG. 6 is a cross-sectional view of the core substrate illustrated in FIG. 5 taken along line F6-F6.

FIG. 5 is a schematic planar view of a core substrate according to another aspect of the present invention. FIG. 6 is a cross-sectional view of the core substrate illustrated in FIG. 5 taken along line F6-F6.

The core substrate 1 further includes a capacitor 50. The capacitor 50 is typically a thin-film capacitor. The capacitor 50 is formed from a first electrode 51, a second electrode 52, and a dielectric layer 53.

The first electrode 51 is provided on at least a portion of the first conductor pattern 20. The second electrode 52 is disposed between the first electrode 51 and the first conductor pattern 20. The dielectric layer 53 is disposed between the first electrode 51 and the second electrode 52.

Each of the electrodes 51 and 52 may be a single layer or include two or more layers. The compositions and other properties of the electrodes 51 and 52 are similar to the compositions and other properties of the metal-containing layers 211 and 311.

The dielectric layer 53 contains an inorganic compound, for example. Examples of the inorganic compound include oxide, carbide, nitride, and boride containing at least one kind of element selected from the group consisting of aluminum, titanium, tantalum, chromium, lanthanum, samarium, ytterbium, yttrium, gadolinium, zirconium, niobium, hafnium, gallium, cerium, and silicon.

The dielectric layer 53 desirably contains at least one of silicon nitride, tantalum oxide, and aluminum oxide. Silicon nitride, tantalum oxide, and aluminum oxide are low in dielectric constant and are excellent in insulation properties.

The dielectric layer 53 is typically formed by sputtering or chemical vapor deposition (CVD).

The capacitor 50 may not include the second electrode 52. That is, the capacitor 50 may be formed from the first electrode 51, a portion of the first conductor pattern 20 opposed to the first electrode 51, and the dielectric layer 53.

The capacitor 50 may further include a copper plating layer on at least a portion of the first electrode 51. The compositions and other properties of the copper plating layer are similar to the compositions and other properties of the copper plating layers 22 and 32 described above.

The capacitor 50 may be provided on both the first conductor pattern 20 and the second conductor pattern 30. In addition, a plurality of capacitors 50 may be provided on one of the conductor patterns 20 and 30 or may be provided on both of the conductor patterns 20 and 30.

Figure 7:
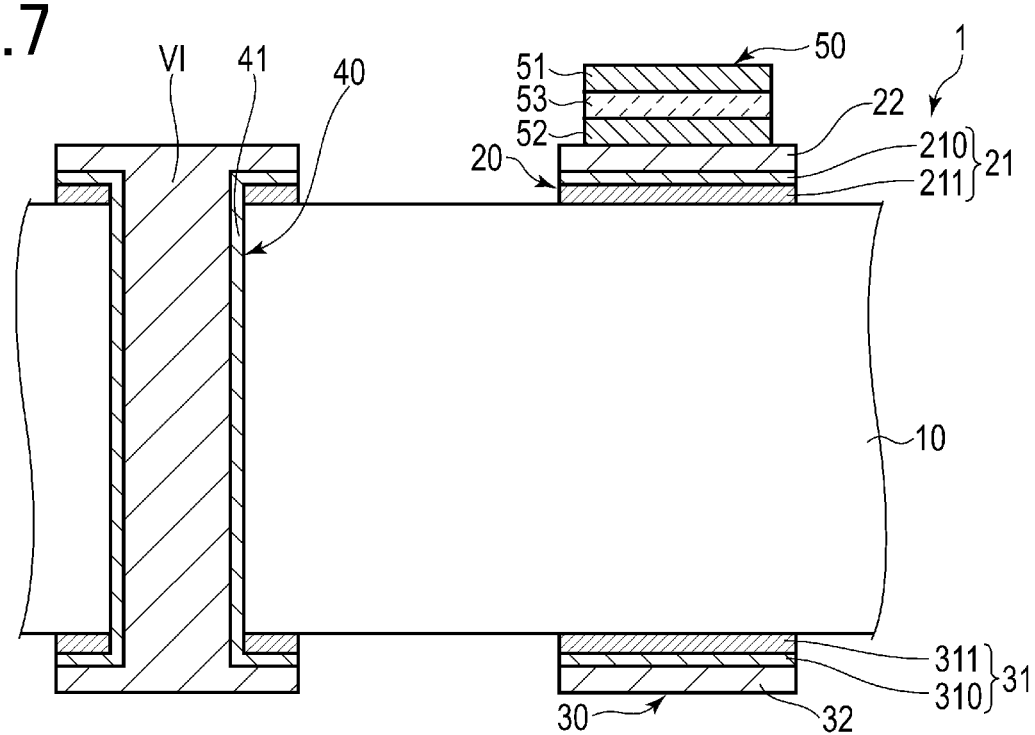
FIG. 7 is a schematic cross-sectional view of a first modification example of the core substrate illustrated in FIGS. 5 and 6.
Figure 8:
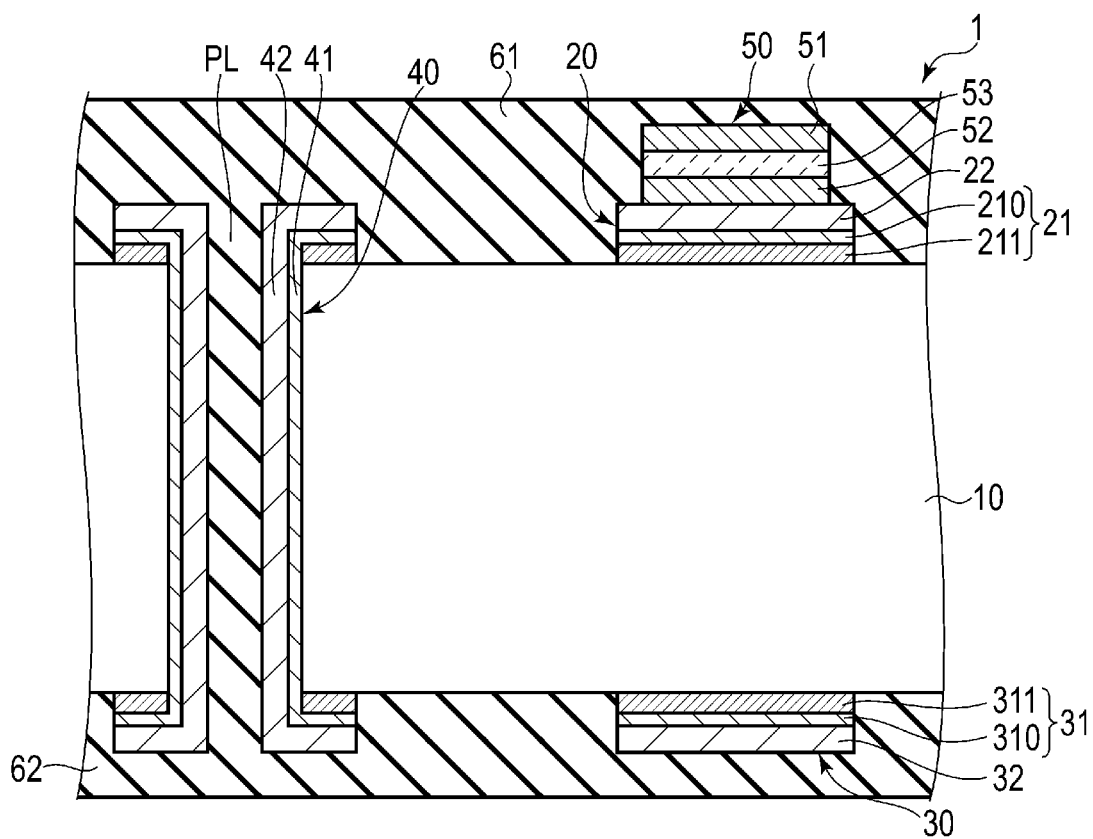
FIG. 8 is a schematic cross-sectional view of a second modification example of the core substrate illustrated in FIGS. 5 and 6.

As illustrated in FIGS. 7 and 8, the first and second modification examples described above are applicable to the core substrate 1 according to the other aspect illustrated in FIGS. 5 and 6.

FIG. 7 is a schematic cross-sectional view of a first modification example of the core substrate illustrated in FIGS. 5 and 6. The core substrate 1 further includes a via VI made of copper.

FIG. 8 is a schematic cross-sectional view of a second modification example of the core substrate illustrated in FIGS. 5 and 6. The core substrate 1 further includes a plug PL made of resin, the first insulation layer 61, and the second insulation layer 62.

The technique for the core substrate 1 described above is also applicable to a copper-clad substrate. That is, a copper-clad substrate according to still another aspect of the present invention includes a glass plate, a nickel plating layer, and a copper plating layer.

The nickel plating layer is provided on the first main surface of the glass plate. The compositions and other properties of the nickel plating layer are similar to the compositions and other properties of the nickel plating layers 210 and 310.

The copper plating layer is provided on the nickel plating layer. The composition and other properties of the copper plating layer are similar to the compositions and other properties of the copper plating layers 22 and 32.

Figure 9:
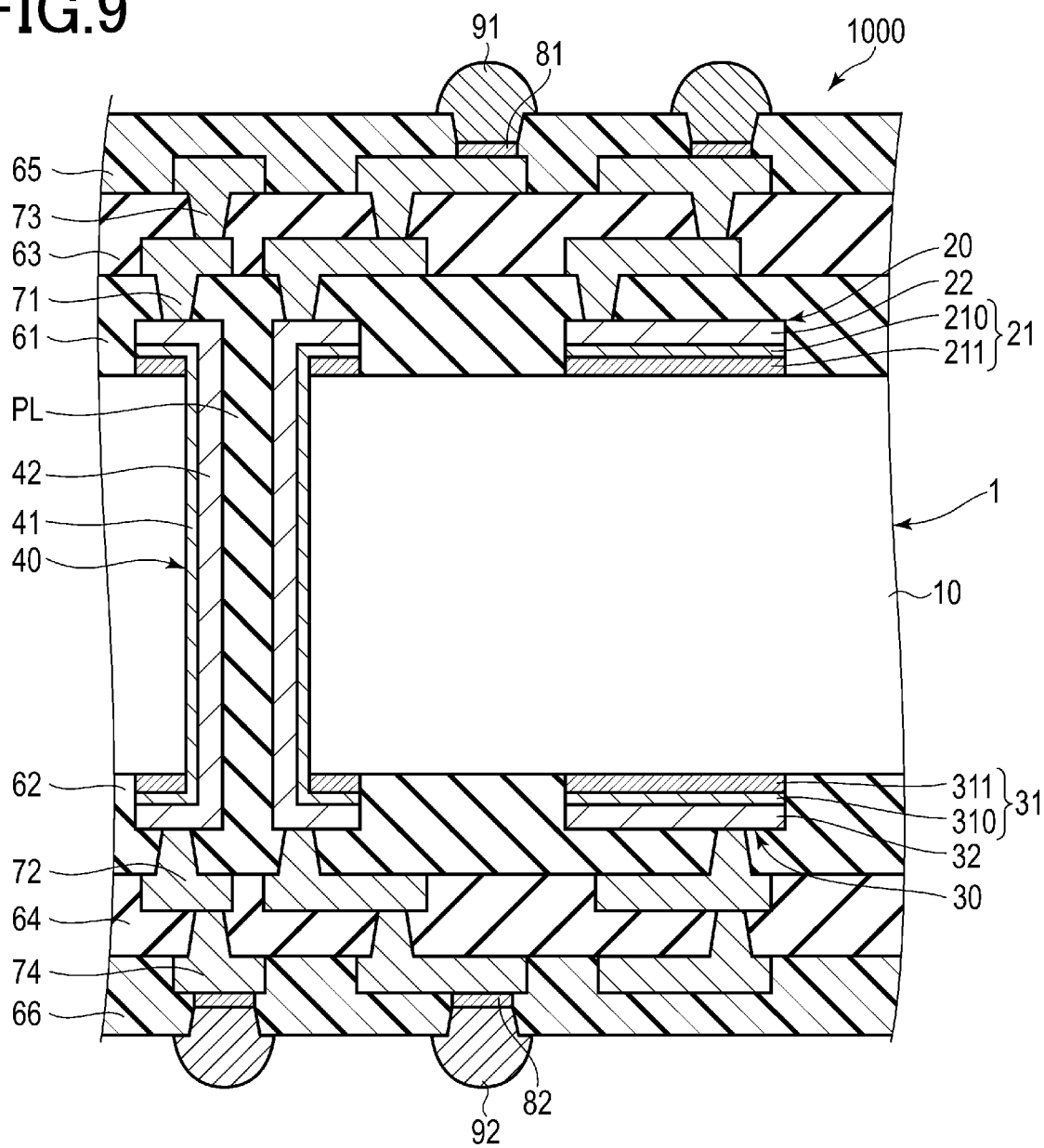
FIG. 9 is a schematic cross-sectional view of a multi-layer wiring substrate including the core substrate illustrated in FIG. 4.

FIG. 9 is a schematic cross-sectional view of a multi-layer wiring substrate including the core substrate illustrated in FIG. 4. The multi-layer wiring substrate 100 includes the core substrate 1 illustrated in FIG. 4, a first insulation layer 61, a second insulation layer 62, a third insulation layer 63, a fourth insulation layer 64, a fifth insulation layer 65, a sixth insulation layer 66, a first wiring layer 71, a second wiring layer 72, a third wiring layer 73, a fourth wiring layer 74, a first surface treatment layer 81, a second surface treatment layer 82, a first solder layer 91, and a second solder layer 92.

The first insulation layer 61 is disposed between the first conductor pattern 20 and the first wiring layer 71. The second insulation layer 62 is disposed between the second conductor pattern 30 and the second wiring layer 72. The third insulation layer 63 is disposed between the first wiring layer 71 and the third wiring layer 73. The fourth insulation layer 64 is disposed between the second wiring layer 72 and the fourth wiring layer 74.

The compositions and other properties of the insulation layers 63 and 64 are typically similar to the compositions and other properties of the insulation layers 61 and 62 described above. The compositions of the insulation layers 61 to 64 are preferably identical.

The fifth insulation layer 65 covers at least a portion of the third wiring layer 73. The sixth insulation layer 66 covers at least a portion of the fourth wiring layer 74.

The insulation layers 65 and 66, that is, the insulation layers positioned on the surface of the multi-layer wiring substrate 1000 typically contain an epoxy resin, a polyimide resin, a maleimide resin, polyethylene terephthalate, polyphenylene oxide, liquid crystal polymer, and a composite material of them. The insulation layers 65 and 66 are preferably solder resists. Using solder resists as the insulation layers 65 and 66 can suppress the occurrence of short-circuits between solder portions (for example, solder balls) that are provided in the same solder layer and are separated from each other.

The first wiring layer 71 is opposed to the glass plate 10 with the first conductor pattern 20 therebetween. The second wiring layer 72 is opposed to the glass plate 10 with the second conductor pattern 30 therebetween. The third wiring layer 73 is opposed to the glass plate 10 with the first wiring layer 71 therebetween. The fourth wiring layer 74 is opposed to the glass plate 10 with the second wiring layer 72 therebetween.

The wiring layers 71 to 74 constitute circuit wirings and electrode pads, for example. The wiring layers 71 to 74 can be formed by a publicly known method such as a subtractive method, a semi-additive method, or an additive method.

The wiring layers 71 to 74 preferably contain copper or copper alloy from the viewpoint of electrical conductivity. The compositions and other properties of the wiring layers 71 to 74 are typically similar to the compositions and other properties of the copper plating layers 22 and 32.

The first surface treatment layer 81 is disposed between the third wiring layer 73 and the first solder layer 91. The first surface treatment layer 81 improves the bonding between the third wiring layer 73 and the first solder layer 91.

The second surface treatment layer 82 is disposed between the fourth wiring layer 74 and the second solder layer 92. The second surface treatment layer 82 improves the bonding between the fourth wiring layer 74 and the second solder layer 92.

The surface treatment layers 81 and 82 can be plating films from tin plating, tin alloy plating, electroless Ni—P/electroless Pd—P/Au plating, or electroless Ni—P/Au plating. The surface treatment layers 81 and 82 may be organic films instead of plating films. The organic films may be pre-solder treatment films or pre-flux treatment films such as organic solderability preservative (OSP).

The first solder layer 91 is provided on the first surface treatment layer 81. The second solder layer 92 is provided on the second surface treatment layer 82. Each of the solder layers 91 and 92 typically includes a plurality of solder portions.

The solder layers 91 and 92 contain tin, silver, copper, bismuth, lead, zinc, indium, antimony, or a mixture of them.

The multi-layer wiring substrate 1000 has been described as including two wiring layers and three insulation layers on both surfaces as an example. However, one wiring layer or three or more wiring layers may be included. Alternatively, two insulation layers or four or more insulation layers may be included.

The multi-layer wiring substrate 1000 has been described as including the core substrate 1 illustrated in FIG. 4 as an example. However, the multi-layer wiring substrate 1000 may include the core substrate 1 illustrated in FIGS. 1 and 2 or the core substrate 1 illustrated in FIG. 3.

The multi-layer wiring substrate 1000 has been described as including the surface treatment layers 81 and 82 as an example. However, the surface treatment layers 81 and 82 may be omitted.

The multi-layer wiring substrate 1000 has been described as including the solder layers 91 and 92 as an example. However, wire bonding pads may be used instead of the solder layers 91 and 92.

Figure 10:
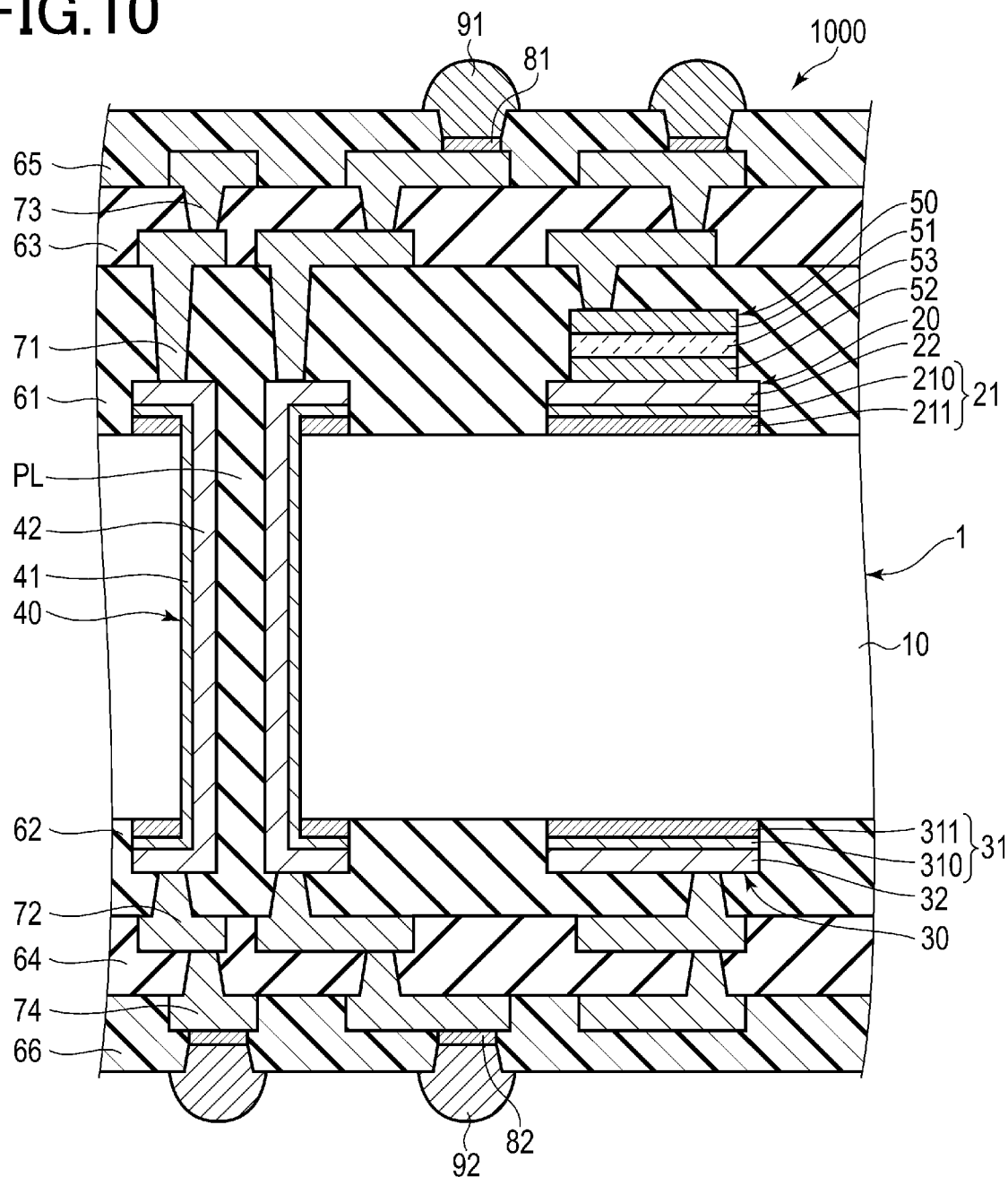
FIG. 10 is a schematic cross-sectional view of a multi-layer wiring substrate including the core substrate illustrated in FIG. 8.

FIG. 10 is a schematic cross-sectional view of a multi-layer wiring substrate including the core substrate illustrated in FIG. 8. A multi-layer wiring substrate 1000 illustrated in FIG. 10 is configured in the same manner as the multi-layer wiring substrate 1000 illustrated in FIG. 9 except that a capacitor 50 is further included and a first electrode 51 of the capacitor 50 is electrically connected to a portion of a first wiring layer 71.

Figure 11:
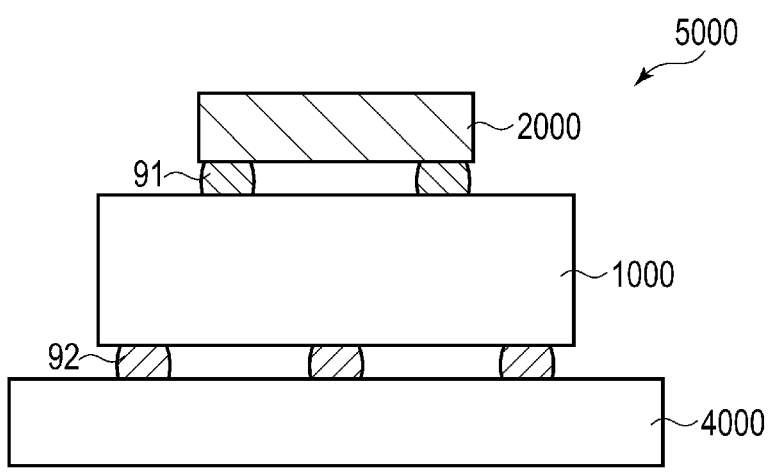
FIG. 11 is a schematic cross-sectional view of an example of a semiconductor module including the multi-layer wiring substrate illustrated in FIG. 9 or 10.

FIG. 11 is a schematic cross-sectional view of an example of a semiconductor module including the multi-layer wiring substrate illustrated in FIG. 9 or 10. A semiconductor module 5000 includes a mother board 4000, a semiconductor chip 2000, and the multi-layer wiring substrate 1000 illustrated in FIG. 9 or 10.

The multi-layer wiring substrate 1000 is disposed between the semiconductor chip 2000 and the mother board 4000 to connect them electrically. That is, the multi-layer wiring substrate 1000 can function as an interposer of the semiconductor module 5000.

The semiconductor chip 2000 is connected to the multi-layer wiring substrate 1000 with the first solder layer 91 therebetween. The multi-layer wiring substrate 1000 is connected to the mother board 4000 with the second solder layer 92 therebetween.

The semiconductor chip 2000 is an integrated circuit (IC), a large-scale integrated circuit (LSI), or a solid-state imaging element, for example. The integrated circuit includes a semiconductor substrate and elements such as a transistor and a diode provided on the semiconductor substrate. The solid-state imaging element is a CMOS image sensor or a CCD sensor, for example. The semiconductor chip 2000 has an approximately rectangular solid shape as an example.

The semiconductor substrate can be a substrate having an inorganic substance as the main component such as a silicon substrate (Si substrate), a gallium nitride substrate (GaN substrate), or a silicon carbide substrate (SiC substrate). The semiconductor substrate is preferably a silicon substrate.

The coefficient of thermal expansion of a silicon substrate in the temperature range of 20° C. to 260° C. is in the range of about $2 \times 10^{-6}$/K to $4 \times 10^{-6}$/K. That is, using a silicon substrate as the semiconductor substrate makes it possible to reduce the difference between the coefficient of thermal expansion of the semiconductor chip 2000 in the temperature range of 20° C. to 260° C. and the coefficient of thermal expansion of the multi-layer wiring substrate 1000 in the temperature range of 20° C. to 260° C. This small difference allows implementation of the packaging with less residual stress.

Figure 12:
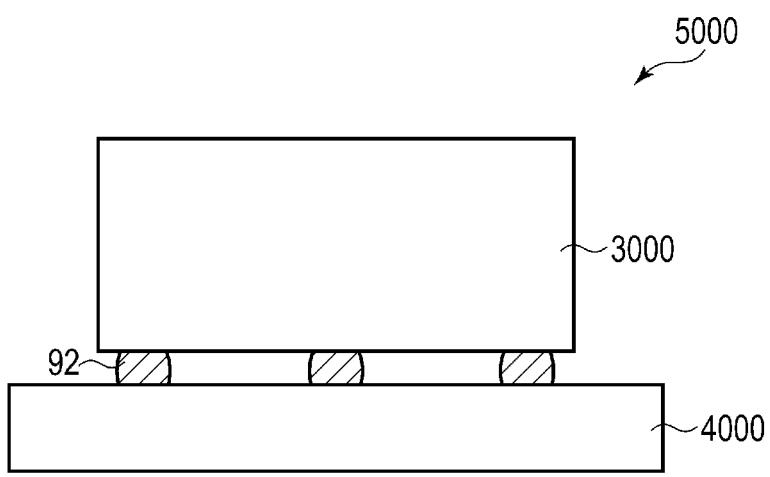
FIG. 12 is a schematic cross-sectional view of another example of a semiconductor module including the multi-layer wiring substrate illustrated in FIG. 9 or 10.

FIG. 12 is a schematic cross-sectional view of another example of a semiconductor module including the multi-layer wiring substrate illustrated in FIG. 9 or 10. The semiconductor module 5000 includes a semiconductor package 3000 and a mother board 4000.

The semiconductor package 3000 includes the multi-layer wiring substrate 1000 illustrated in FIG. 9 or 10, a semiconductor chip 2000, and a sealing resin. In an example, the semiconductor chip 2000 is a flip chip-implemented on the multi-layer wiring substrate 1000. In this case, the sealing resin fills the gap between the semiconductor chip 2000 and the multi-layer wiring substrate 1000.

The semiconductor package 3000 and the mother board 4000 are connected together with the second solder layer 92 included in the multi-layer wiring substrate 1000 therebetween.

The semiconductor module 5000 has been described as being connected to the multi-layer wiring substrate 1000 with the solder layers 91 and 92 therebetween as an example. However, instead of the solder layers 91 and 92, the semiconductor module 5000 may be connected by a columnar metal-containing layer such as a copper post, for example. This copper post preferably further includes a surface treatment layer and a solder layer.

Next, an example of a method for manufacturing the multi-layer wiring substrate 1000 will be described.

First, an example of a method for manufacturing the core substrate 1 illustrated in FIGS. 1 and 2 will be described with reference to FIGS. 13A to 13F. FIGS. 13A to 13F are cross-sectional diagrams schematically illustrating an example of a method for manufacturing the core substrate illustrated in FIGS. 1 and 2.

Figure 13A:
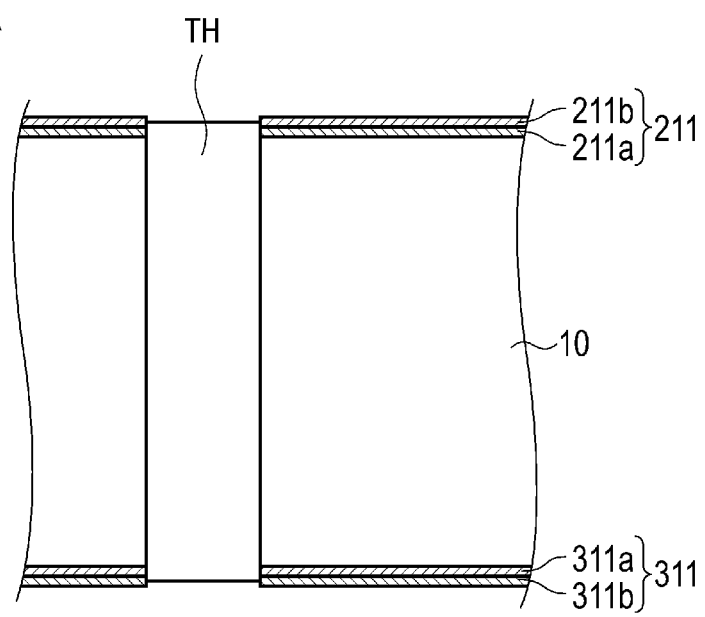
FIG. 13A is a schematic cross-sectional view illustrating an example of a method for manufacturing the core substrate illustrated in FIGS. 1 and 2.

First, the glass plate 10 with the through hole TH is prepared. Next, as illustrated in FIG. 13A, the first metal-containing layer 211 is formed on the first main surface of the glass plate 10, and the second metal-containing layer 311 is formed on the second main surface. Specifically, titanium is deposited on the first main surface of the glass plate 10 by sputtering or CVD to form a first titanium layer 211a. The same method is used to form a second titanium layer 311a on the second main surface of the glass plate 10. Then, copper is deposited on the titanium layers 211a and 311a by sputtering or CVD to form a first copper layer 211b and a second copper layer 311b, respectively.

Figure 13B:
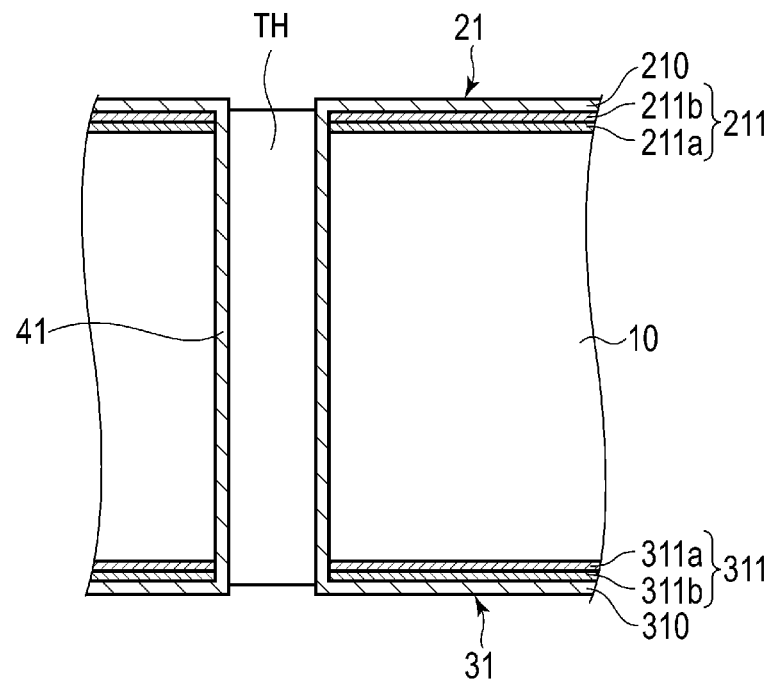
FIG. 13B is a schematic cross-sectional view illustrating the example of the method for manufacturing the core substrate illustrated in FIGS. 1 and 2.

Next, as illustrated in FIG. 13B, by electroless plating, the nickel plating layers 210 and 310 are formed respectively on the metal-containing layers 211 and 311, and the third nickel plating layer is formed on the side wall of the through hole TH. In this manner, the first seed layer 21, the second seed layer 31, and the third seed layer 41 are obtained.

An electroless nickel plating liquid includes metallic salt containing nickel and a reducing agent.

The metallic salt containing nickel can be nickel sulfate, nickel chloride, or a mixture of them, for example.

The density of the metallic salt containing nickel included in the electroless nickel plating liquid is preferably in the range of 10 g/L to 50 g/L, more preferably in the range of 15 g/L to 45 g/L, and further preferably in the range of 20 g/L to 30 g/L.

The reducing agent reduces the metallic salt containing nickel.

The reducing agent can be formalin, hydrazine, hypophosphorous acid, sodium hypophosphite, sodium borohydride, or a mixture of them, for example.

The density of the reducing agent included in the electroless nickel plating liquid is preferably in the range of 10 g/L to 50 g/L, more preferably in the range of 15 g/L to 45 g/L, and further preferably in the range of 20 g/L to 30 g/L.

The electroless nickel plating liquid may further include a metal-based additive, an organic additive, a complexing agent, a pH adjusting agent, a buffering agent, or a mixture of them.

The metal-based additive enhances the stability of the electroless nickel plating liquid. The metal-based additive contains lead salt, bismuth salt, or a mixture of these.

The organic additive facilitates the precipitation of nickel. The organic additive contains sulfur, for example.

The complexing agent can be ammonium hydroxide, sodium citrate, ethylene glycol, or a mixture of them, for example.

The density of the complexing agent included in the electroless nickel plating liquid is preferably in the range of 10 g/L to 50 g/L, more preferably in the range of 10 g/L to 40 g/L, and further preferably in the range of 20 g/L to 30 g/L.

The pH adjusting agent can be sodium hydroxide, ammonia, sulfuric acid, or a mixture of them, for example.

The buffering agent can be sodium citrate, boric acid, carbonic acid, or a mixture of them.

The electroless nickel plating liquid may contain ammonium chloride.

The density of the ammonium chloride contained in the electroless nickel plating liquid is preferably in the range of 10 g/L to 50 g/L, more preferably in the range of 10 g/L to 40 g/L, and further preferably in the range of 20 g/L to 30 g/L.

In the electroless plating process, the pH of the electroless nickel plating liquid is preferably in the range of 7.5 to 10.0, more preferably in the range of 8.0 to 9.5, and further preferably in the range of 8.2 to 9.3.

The temperature of the electroless nickel plating liquid is preferably in the range of 30° C. to 60° C., for example, more preferably in the range of 35° C. to 55° C., and further preferably falls in the range of 40° C. to 50° C.

Next, a dry film resist is laminated on the first nickel plating layer 210 by using a roll lamination device or the like to form a first resist layer RE1. The same method is used to form a second resist layer RE2 on the second nickel plating layer 310.

These resist layers may be formed by applying a resist material with fluidity.

Figure 13C:
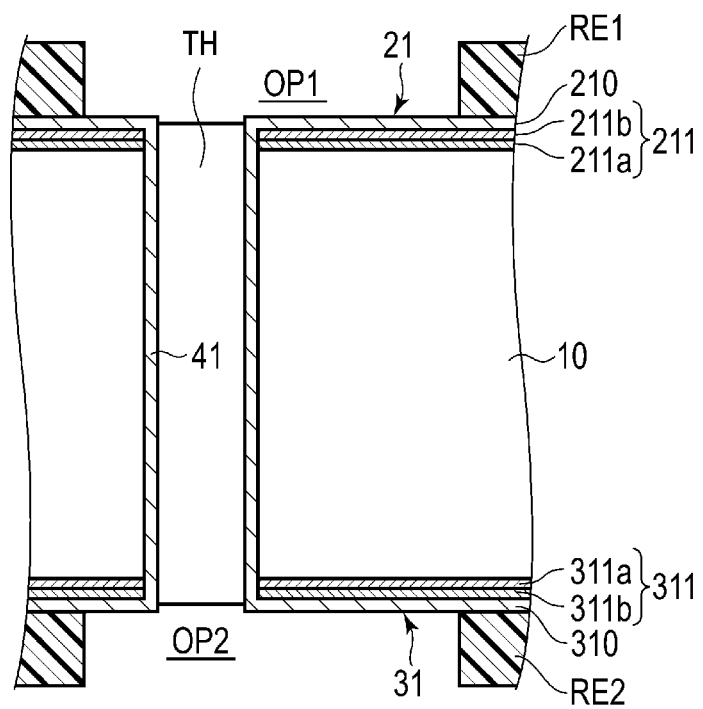
FIG. 13C is a schematic cross-sectional view illustrating the example of the method for manufacturing the core substrate illustrated in FIGS. 1 and 2.

Next, as illustrated in FIG. 13C, a portion of the first resist layer RE1 is removed by photolithography to provide a first opening portion OP1. The same method is used to remove a portion of the second resist layer RE2 to provide a second opening portion OP2.

Figure 13D:
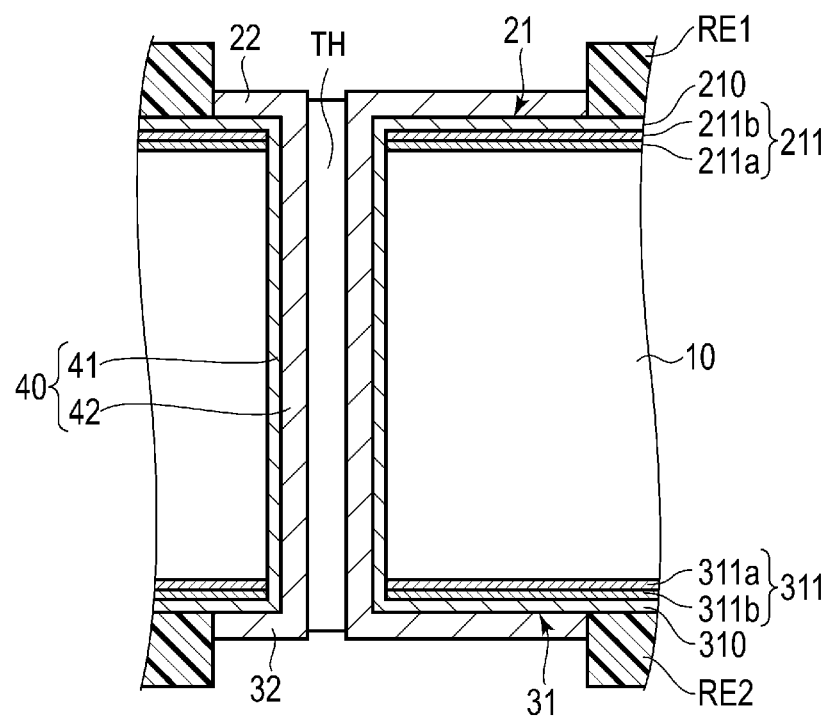
FIG. 13D is a schematic cross-sectional view illustrating the example of the method for manufacturing the core substrate illustrated in FIGS. 1 and 2.

Next, the first copper plating layer 22, the second copper plating layer 32, and the conductor layer 40 are formed as illustrated in FIG. 13D. Specifically, by electrolytic plating, the first copper plating layer 22 and the second copper plating layer 32 are formed respectively on a portion of the first nickel plating layer 210 not covered with the first resist layer RE1 and on a portion of the second nickel plating layer 310 not covered with the second resist layer RE2, and the third copper plating layer 42 is formed on the third seed layer 41.

Next, the resist layers RE1 and RE2 are stripped by using a resist stripping liquid such as an alkaline solution as illustrated in FIG. 13E.

Next, the first conductor pattern 20 and the second conductor pattern 30 are formed as illustrated in FIG. 13F.

Specifically, first, an acid is used as a first etching agent to etch portions of the first nickel plating layer 210 and the first copper layer 211b not covered with the first copper plating layer 22 and portions of the second nickel plating layer 310 and the second copper layer 311b not covered with the second copper plating layer 32.

The first etching agent is preferably an acid aqueous solution with a pH ranging from 0.5 to 2. The acid aqueous solution preferably contains at least one of sulfuric acid and aqueous hydrogen peroxide, and more preferably contains both of them.

The temperature of the first etching agent is preferably in the range of 20° C. to 40° C., and more preferably in the range of 25° C. to 35° C.

Then, a weak alkaline solution as a second etching agent is used to etch a portion of the first titanium layer 211a not covered with the first copper plating layer 22 and a portion of the second titanium layer 311a not covered with the second copper plating layer 32.

The second etching agent is preferably a weak alkaline solution with a pH ranging from 7 to 12, and more preferably a weak alkaline solution with a pH ranging from 8 to 10. The weak alkaline solution is preferably a mixture of ammonia water and aqueous hydrogen peroxide.

The temperature of the second etching agent is preferably in the range of 20° C. to 40° C., and more preferably in the range of 25° C. to 35° C.

In this manner, the core substrate 1 illustrated in FIGS. 1 and 2 can be obtained.

According to this method, the first to third nickel plating layers are formed under the conditions described above. Therefore, in the thus obtained core substrate 1, the phosphorus contents of the first to third nickel plating layers are low as described above.

These nickel plating layers can be etched under the conditions described above. Under these conditions, the glass plate 10 is less susceptible to damage by etching. For example, in the thus obtained core substrate 1, the roughness of the portion of the glass plate 10 exposed by etching the seed layers 21 and 31 remains hardly changed as compared to the roughness of the surface of the glass plate 10 prepared at the start of manufacture.

In an example, the roughness of the surface of the glass plate 10 obtained by using a contactless interference microscope is 0.5 nm before the start of manufacture, and the roughness of the portion exposed by etching the seed layers 21 and 31 is 0.5 nm.

Therefore, the thus obtained core substrate 1 is less prone to become cracked as compared to a core substrate with nickel plating layers in which the phosphorus content is 6 mass % or more.

The inventors have also discovered that the seed layers 21 and 31 of the thus obtained core substrate 1 are less prone to suffer an undercut as compared to the seed layer of a core substrate on which a nickel plating layer with a phosphorus contents of 6 mass % more is provided. Therefore, the core substrate 1 is excellent in electrical characteristics.

According to this method, the nickel plating layers 210 and 310 and the copper layers 211b and 311b can be removed at the same time by using the same etching agent. Therefore, this method shortens the time for manufacturing the core substrate 1.

Next, a method for manufacturing the multi-layer wiring substrate illustrated in FIG. 9 will be described with reference to FIGS. 14A to 14I. FIGS. 14A to 14I are cross-sectional diagrams schematically illustrating an example of a method for manufacturing the multi-layer wiring substrate illustrated in FIG. 9.

Figure 14A:
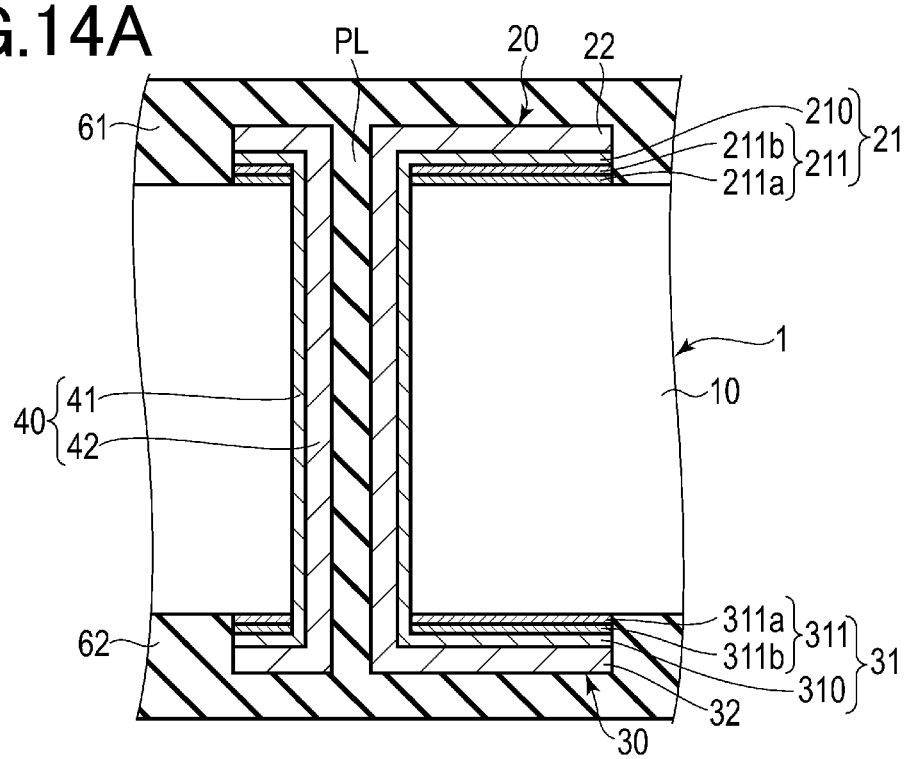
FIG. 14A is a schematic cross-sectional view illustrating an example of a method for manufacturing the multi-layer wiring substrate illustrated in FIG. 9.

First, the core substrate 1 described above with reference to FIG. 4 is prepared as illustrated in FIG. 14A. Specifically, a resin film is laminated on the first and second main surfaces of the core substrate 1 illustrated in FIGS. 1 and 2 by a vacuum lamination method to form the first insulation layer 61 and the second insulation layer 62, and the through hole TH is filled with a resin to form the plug PL.

Figure 14B:
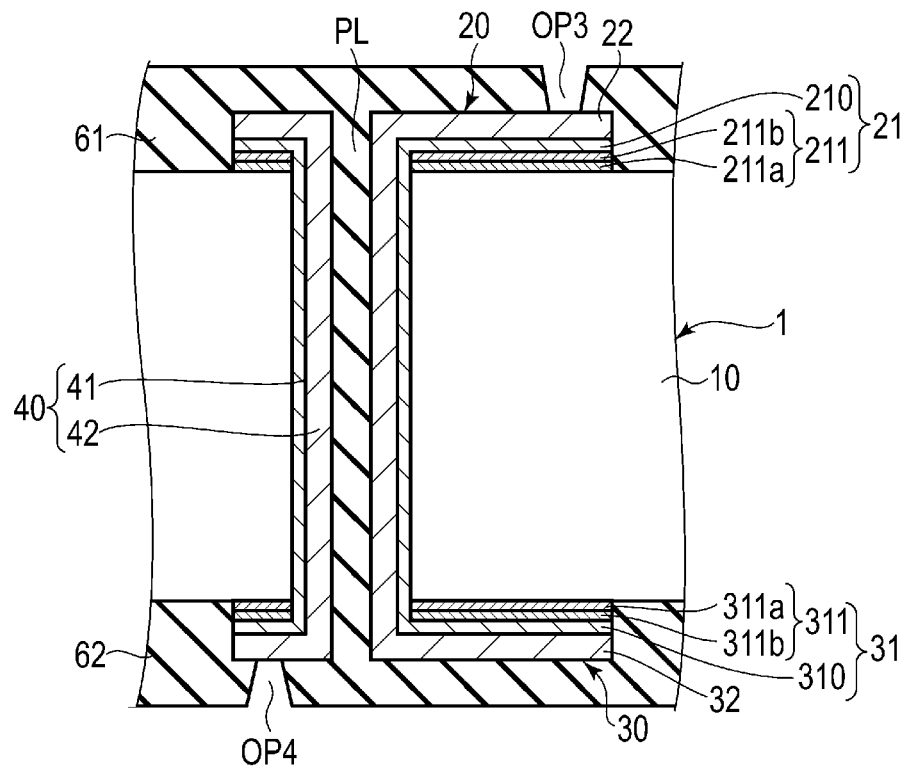
FIG. 14B is a schematic cross-sectional view illustrating the example of the method for manufacturing the multi-layer wiring substrate illustrated in FIG. 9.

Next, the first insulation layer 61 is subjected to laser processing to form a third opening portion OP3 as illustrated in FIG. 14B. The same method is used to form a fourth opening portion OP4 in the second insulation layer 62.

Then, the insulation layers 61 and 62 are subjected to de-smearing treatment to remove smears and roughen the surfaces of the insulation layers 61 and 62.

Figure 14C:
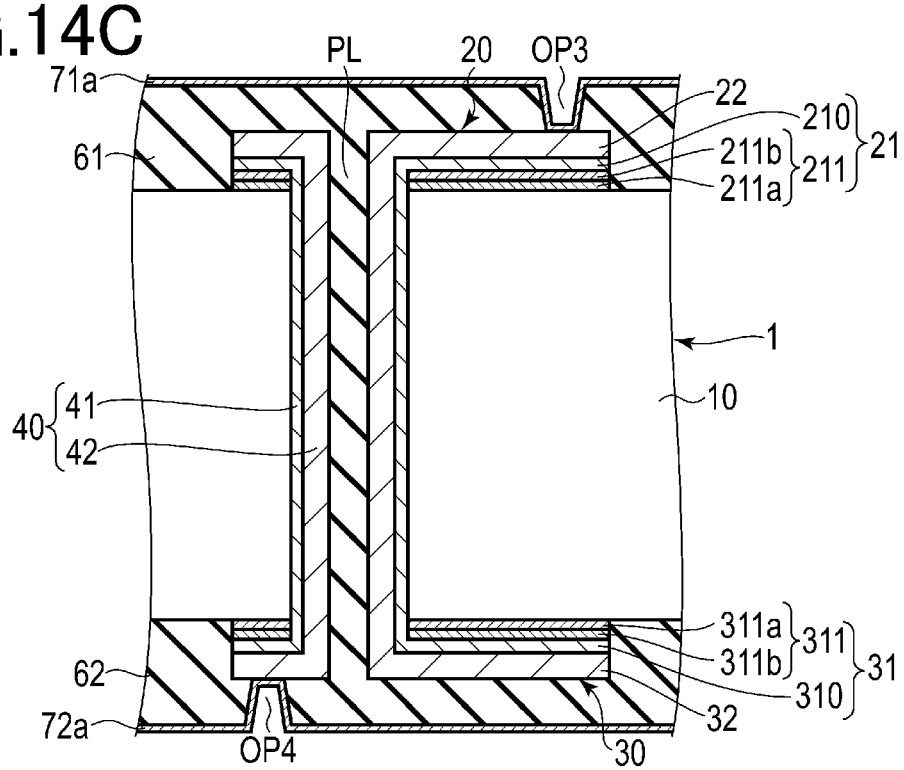
FIG. 14C is a schematic cross-sectional view illustrating the example of the method for manufacturing the multi-layer wiring substrate illustrated in FIG. 9.

Next, a seed layer 71a is formed by electroless plating on the first insulation layer 61 and a portion of the first copper plating layer 22 not covered with the first insulation layer 61 as illustrated in FIG. 14C. The same method is used to form a seed layer 72a on the second insulation layer 62 and a portion of the second copper plating layer 32 not covered with the second insulation layer 62. The seed layer 71a and the seed layer 72a typically contain copper.

Each of the seed layers 71a and 72a may be formed by sputtering or CVD instead of electroless plating. However, the use of electroless plating is preferred from the viewpoint of the ease of deposition on the side walls of the opening portions OP3 and OP4.

Next, a dry film resist is laminated on the seed layer 71a by using a roll lamination device to form a third resist layer RE3. The same method is used to form a fourth resist layer RE4 on the seed layer 72a.

Figure 14D:
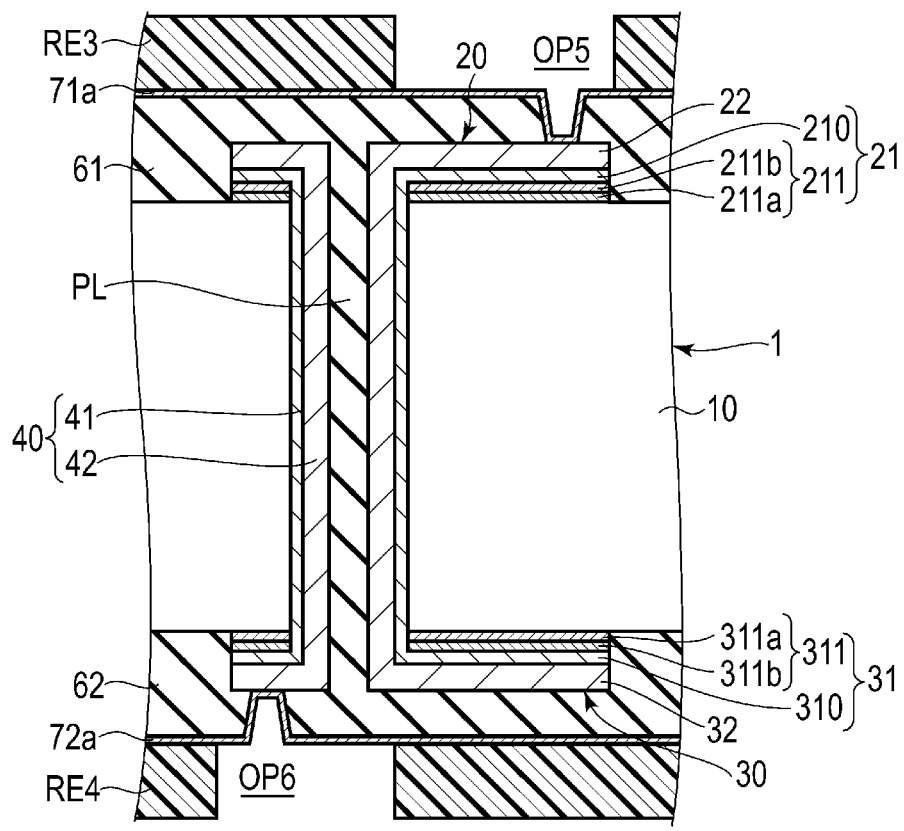
FIG. 14D is a schematic cross-sectional view illustrating the example of the method for manufacturing the multi-layer wiring substrate illustrated in FIG. 9.

Next, a portion of the third resist layer RE3 is removed by photolithography to provide a fifth opening portion OP5 as illustrated in FIG. 14D. The same method is used to remove a portion of the fourth resist layer RE4 to provide a sixth opening portion OP6.

Figure 14E:
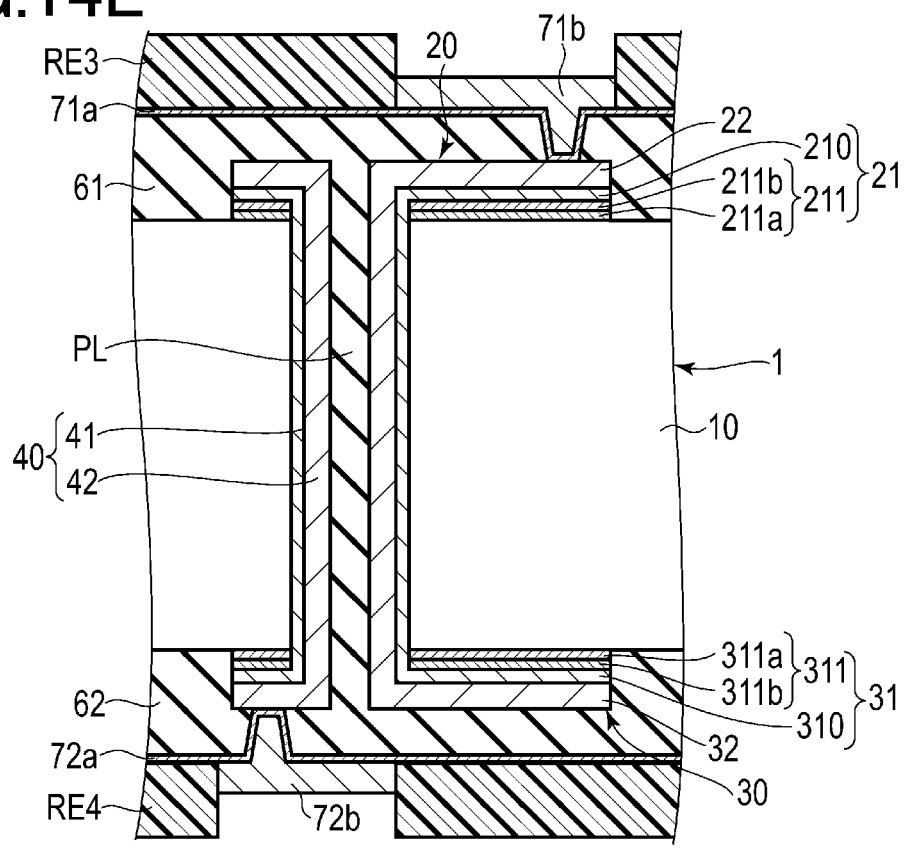
FIG. 14E is a schematic cross-sectional view illustrating the example of the method for manufacturing the multi-layer wiring substrate illustrated in FIG. 9.

Next, by electrolytic plating, a copper plating layer 71b is formed on a portion of the seed layer 71a not covered with the third resist layer RE3 and a copper plating layer 72b is formed on a portion of the seed layer 72a not covered with the fourth resist layer RE4 as illustrated in FIG. 14E.

Next, the resist layers RE3 and RE4 are stripped by using a resist stripping liquid such as an alkaline solution.

Figure 14F:
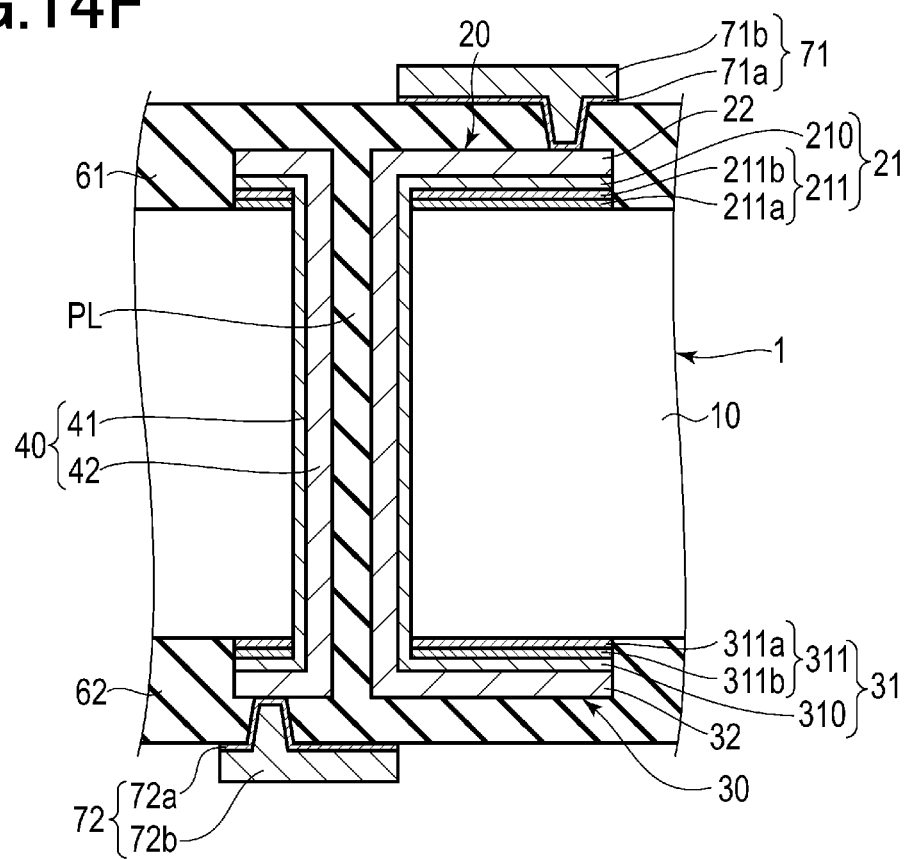
FIG. 14F is a schematic cross-sectional view illustrating the example of the method for manufacturing the multi-layer wiring substrate illustrated in FIG. 9.

Next, a portion of the seed layer 71a not covered with the copper plating layer 71b and a portion of the seed layer 72a not covered with the copper plating layer 72b are etched as illustrated in FIG. 14F. In this manner, the first wiring layer 71 and the second wiring layer 72 are obtained.

Figure 14G:
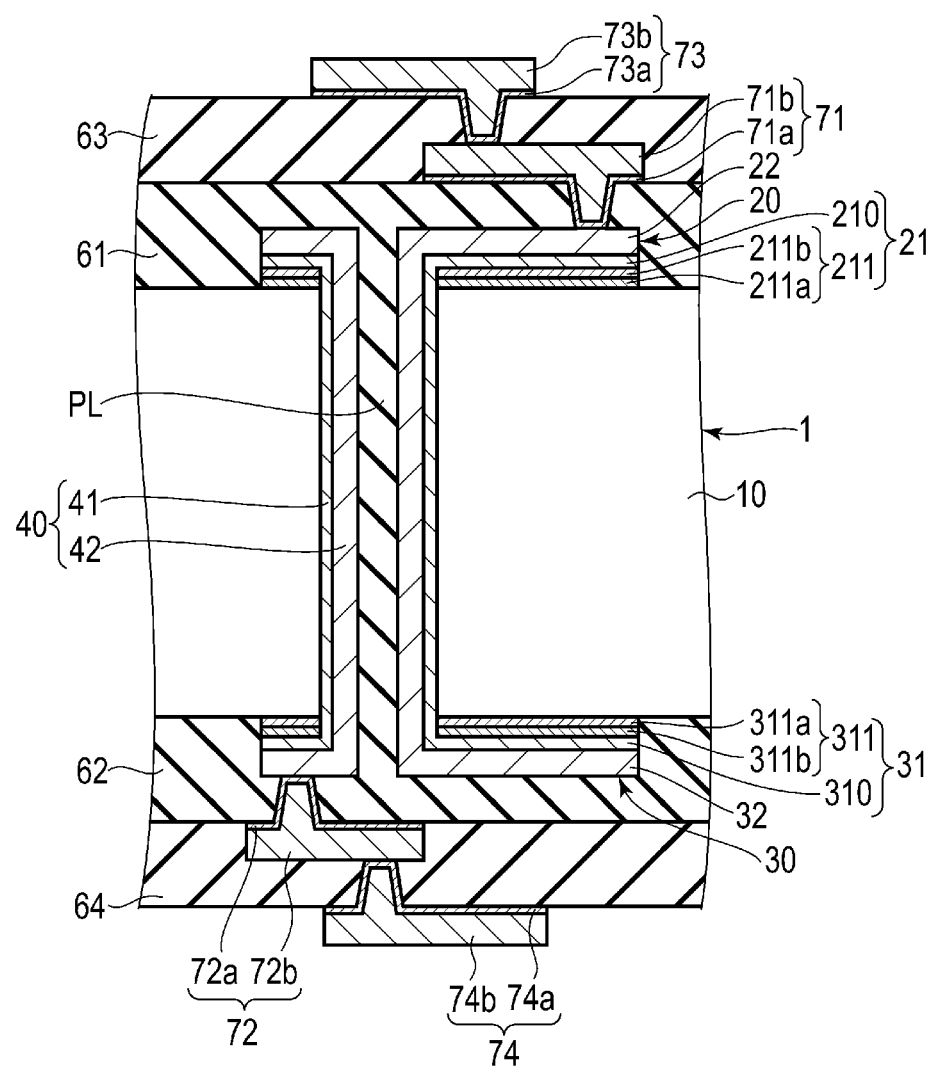
FIG. 14G is a schematic cross-sectional view illustrating the example of the method for manufacturing the multi-layer wiring substrate illustrated in FIG. 9.

Next, the steps described above with reference to FIGS. 14A to 14F are repeated to form the third wiring layer 73 and the fourth wiring layer 74 as illustrated in FIG. 14G. The third wiring layer 73 includes a seed layer 73a and a copper plating layer 73b. The fourth wiring layer 74 includes a seed layer 74a and a copper plating layer 74b.

Next, a film-like solder resist material is laminated by using a lamination device to form the fifth insulation layer 65 on the third insulation layer 63 and the third wiring layer 73. The same method is used to form the sixth insulation layer 66 on the fourth insulation layer 64 and the fourth wiring layer 74. The insulation layers 65 and 66 may be formed by applying a liquid solder resist material.

Figure 14H:
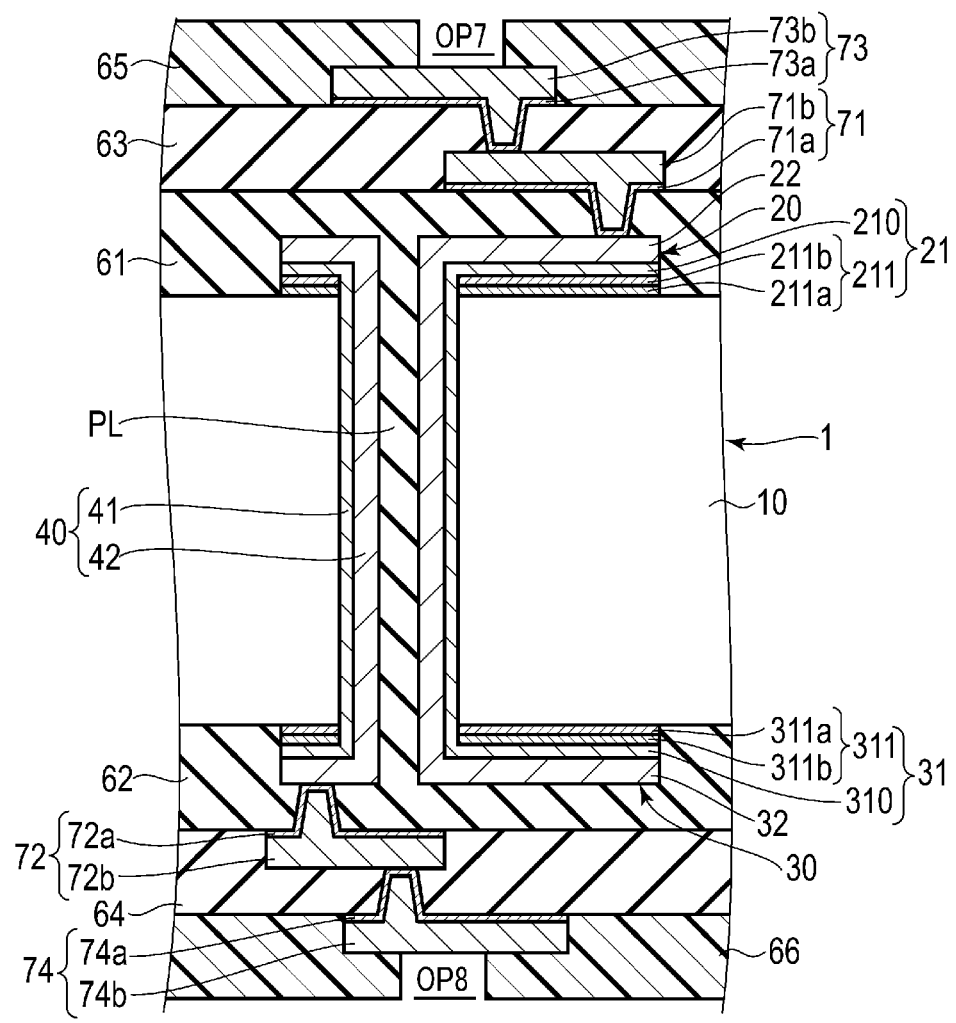
FIG. 14H is a schematic cross-sectional view illustrating the example of the method for manufacturing the multi-layer wiring substrate illustrated in FIG. 9.

Next, a portion of the fifth insulation layer 65 is removed by photolithography or laser processing to form a seventh opening portion OP7 as illustrated in FIG. 14H. The same method is used to remove a portion of the sixth insulation layer 66 to form an eighth opening portion OP8.

Figure 14I:
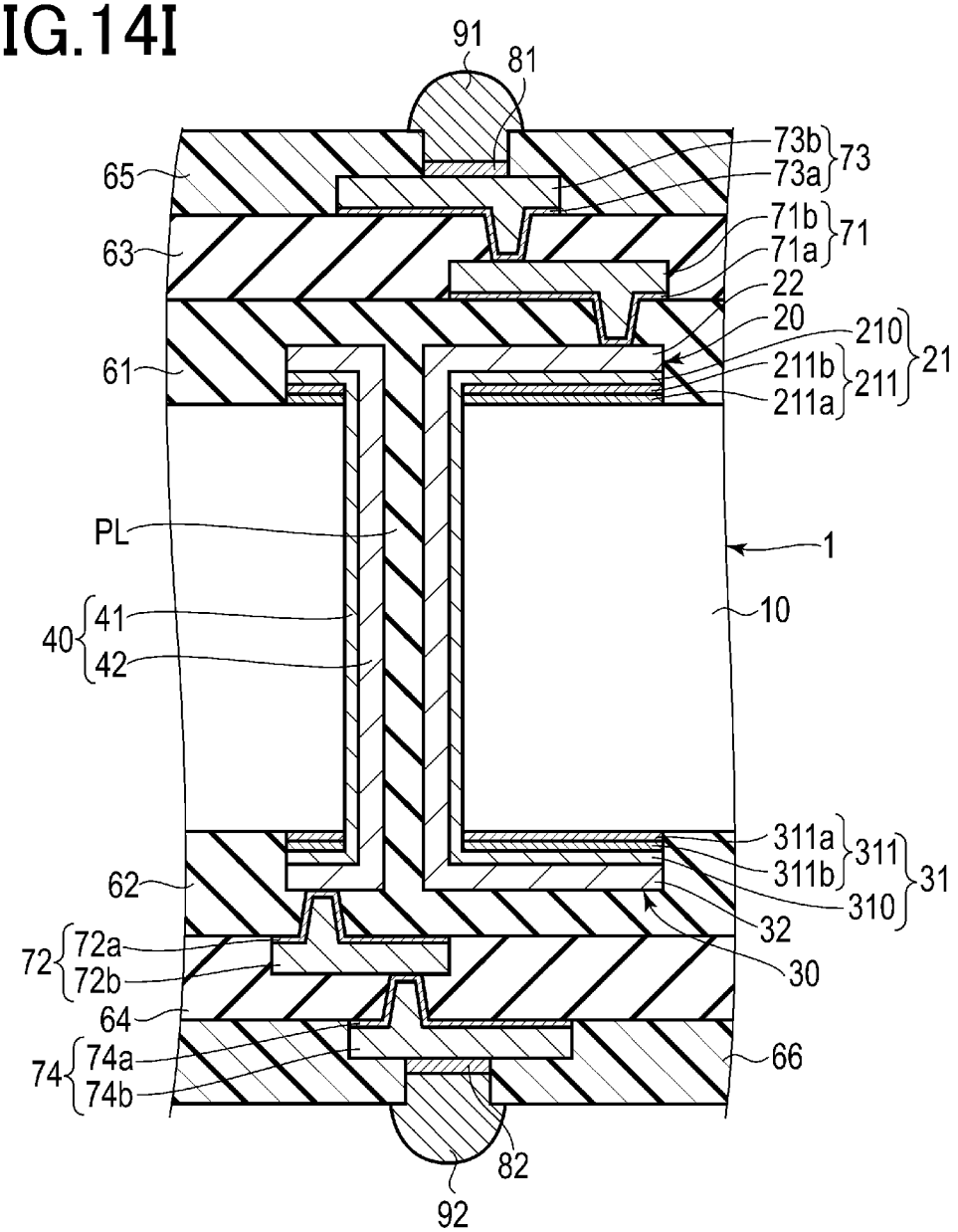
FIG. 14I is a schematic cross-sectional view illustrating the example of the method for manufacturing the multi-layer wiring substrate illustrated in FIG. 9.

Next, by electroless plating, the first surface treatment layer 81 is formed on a portion of the third wiring layer 73 not covered with the fifth insulation layer 65 and the second surface treatment layer 82 is formed on a portion of the fourth wiring layer 74 not covered with the sixth insulation layer 66 as illustrated in FIG. 14I.

Next, the first solder layer 91 is formed on the first surface treatment layer 81 by a publicly known method such as screen printing, solder ball transfer mounting, or electrolytic plating. The same method is used to form the second solder layer 92 on the second surface treatment layer 82.

In this manner, the multi-layer wiring substrate 1000 illustrated in FIG. 9 can be obtained.

Next, a method for manufacturing the multi-layer wiring substrate 1000 illustrated in FIG. 10 will be described.

First, a method for manufacturing the core substrate 1 illustrated in FIGS. 5 and 6 will be described with reference to FIGS. 15A to 15I. FIGS. 15A to 15I are cross-sectional diagram schematically illustrating an example of a method for manufacturing the core substrate illustrated in FIGS. 5 and 6.

First, the same method as described above with reference to FIGS. 13A to 13E is used to prepare a core substrate in which the copper plating layers 22 and 32 are patterned and the seed layers 21 and 31 are not patterned.

Figure 15A:
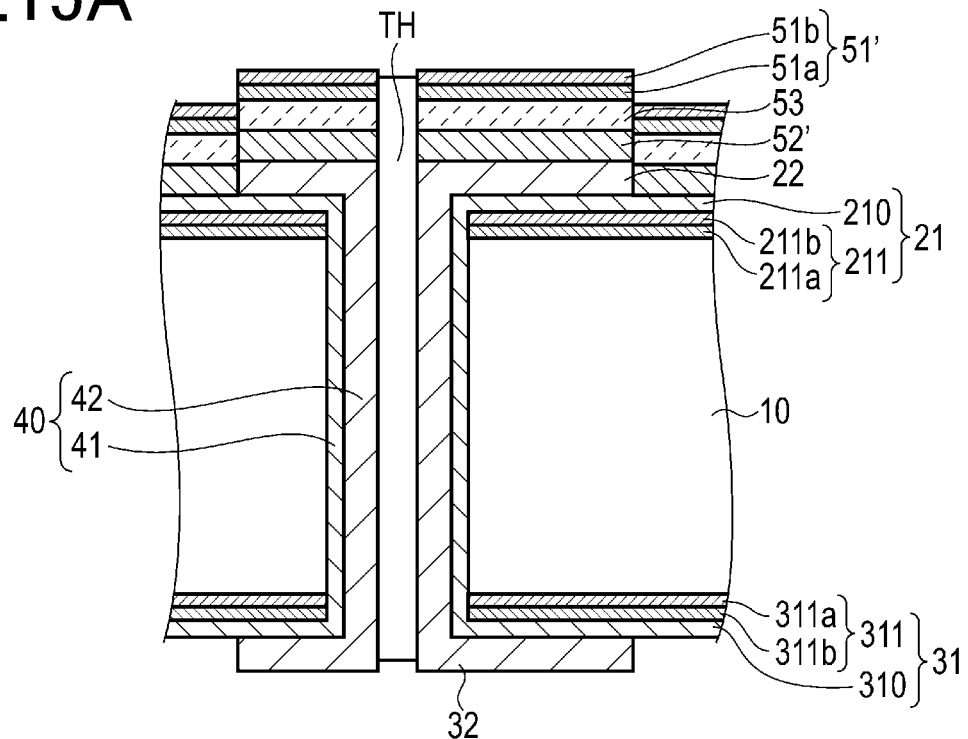
FIG. 15A is a schematic cross-sectional view illustrating an example of a method for manufacturing the core substrate illustrated in FIGS. 5 and 6.

Next, as illustrated in FIG. 15A, a second conductive layer 52' is formed on the first copper plating layer 22 and a portion of the first nickel plating layer 210 not covered with the first copper plating layer 22 by sputtering or CVD. The same method is used to form the dielectric layer 53 on the second conductive layer 52'. The same method is used to form a third titanium layer 51a on the dielectric layer 53. The same method is used to form a third copper layer 51b on the third titanium layer 51a. In this manner, a first conductive layer 51' including the third titanium layer 51a and the third copper layer 51b is obtained. The conductive layers 51' and 52' are layers to be used as the first electrode 51 and the second electrode 52, respectively.

Next, a dry film resist is laminated by using a roll lamination device to form the first resist layer RE1 in such a manner as to cover the first conductive layer 51'. The same method is used to form the second resist layer RE2 on the second copper plating layer 32 and a portion of the second nickel plating layer 310 not covered with the second copper plating layer 32.

Figure 15B:
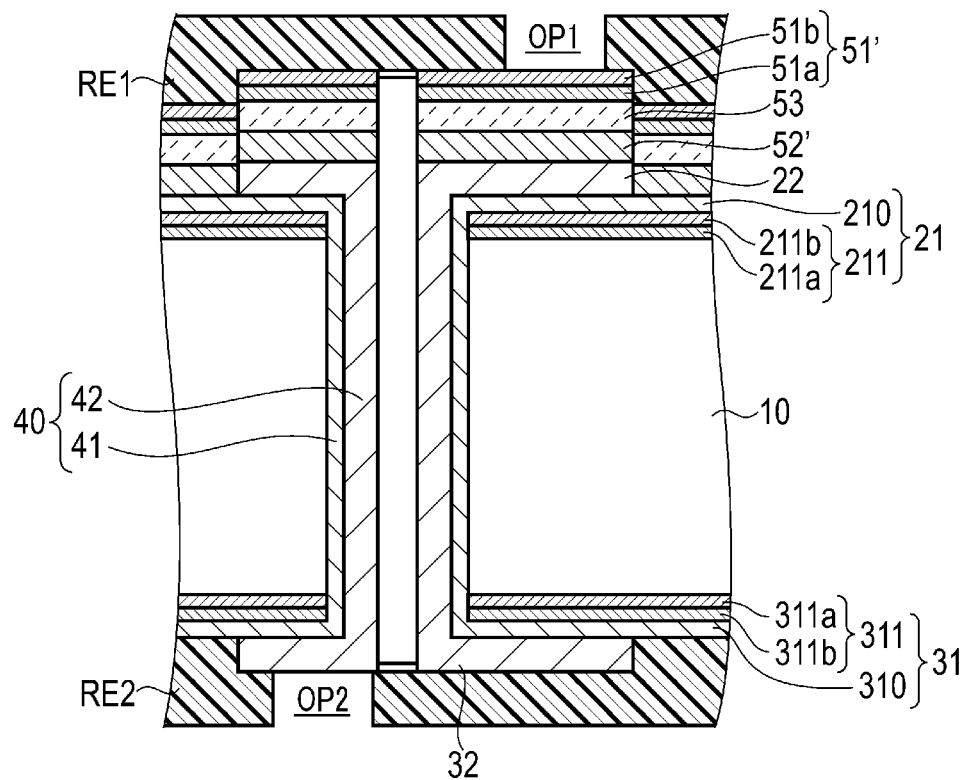
FIG. 15B is a schematic cross-sectional view illustrating the example of the method for manufacturing the core substrate illustrated in FIGS. 5 and 6.

Next, a portion of the first resist layer RE1 is removed by photolithography or laser processing to provide the first opening portion OP1 as illustrated in FIG. 15B. The same method is used to remove a portion of the second resist layer RE2 to provide a second opening portion OP2.

Figure 15C:
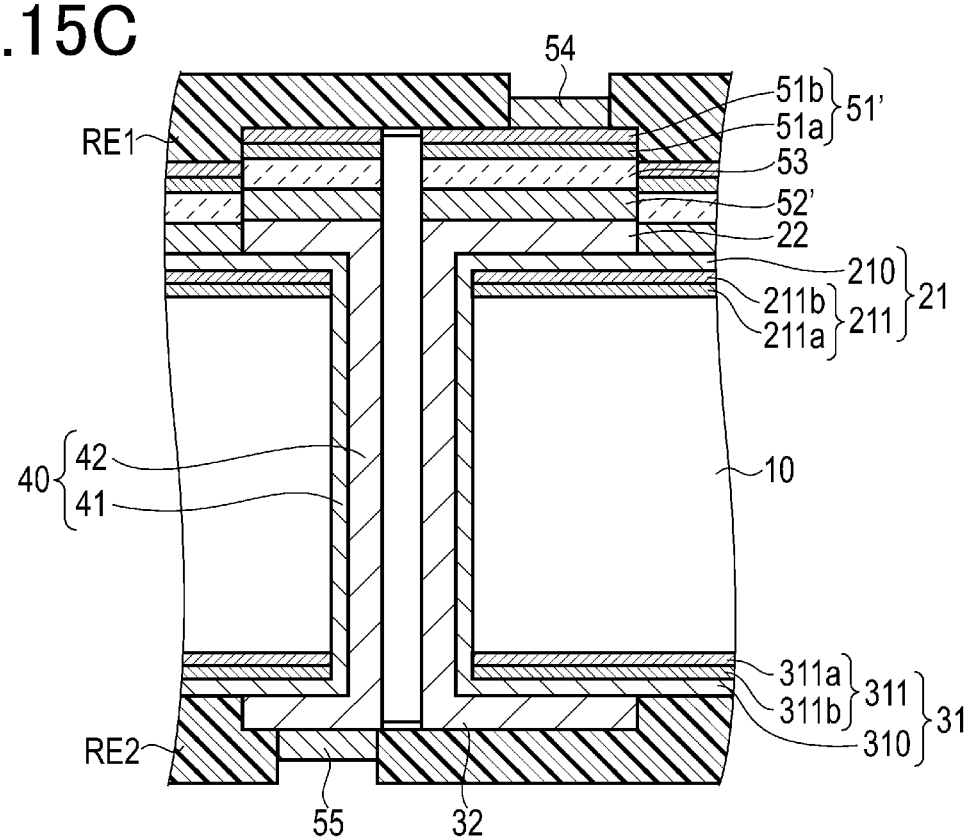
FIG. 15C is a schematic cross-sectional view illustrating the example of the method for manufacturing the core substrate illustrated in FIGS. 5 and 6.

Next, a fourth copper plating layer 54 is formed by electrolytic plating on a portion of the first conductive layer 51' not covered with the first resist layer RE1 as illustrated in FIG. 15C. The same method is used to form a fifth copper plating layer 55 on a portion of the second copper plating layer 32 not covered with the second resist layer RE2.

Figure 15D:
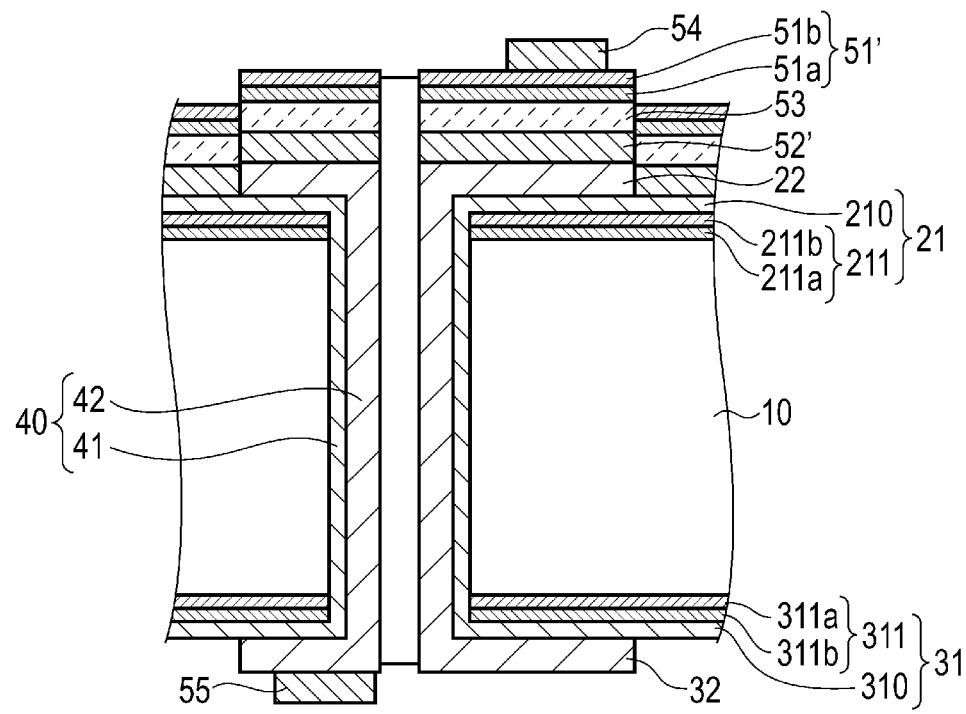
FIG. 15D is a schematic cross-sectional view illustrating the example of the method for manufacturing the core substrate illustrated in FIGS. 5 and 6.

Next, the resist layers RE1 and RE2 are stripped by using a resist stripping liquid such as an alkaline solution as illustrated in FIG. 15D.

Next, a dry film resist is laminated by using a roll lamination device to form the third resist layer RE3 in such a manner as to cover the fourth copper plating layer 54 and a portion of the third copper layer 51b as illustrated in FIG. 15E. The same method is used to form the fourth resist layer RE4 to cover the second copper plating layer 32 and a portion of the second nickel plating layer 310 not covered with the second copper plating layer 32.

Next, portions of the first conductive layer 51', the dielectric layer 53, and the second conductive layer 52' not covered with the third resist layer RE3 are sequentially etched by dry etching to process the conductive layers 51' and 52' into the electrodes 51 and 52 and remove a portion of the dielectric layer 53 not intervening between the electrodes 51 and 52. Wet etching may be performed instead of dry etching.

Figure 15G:
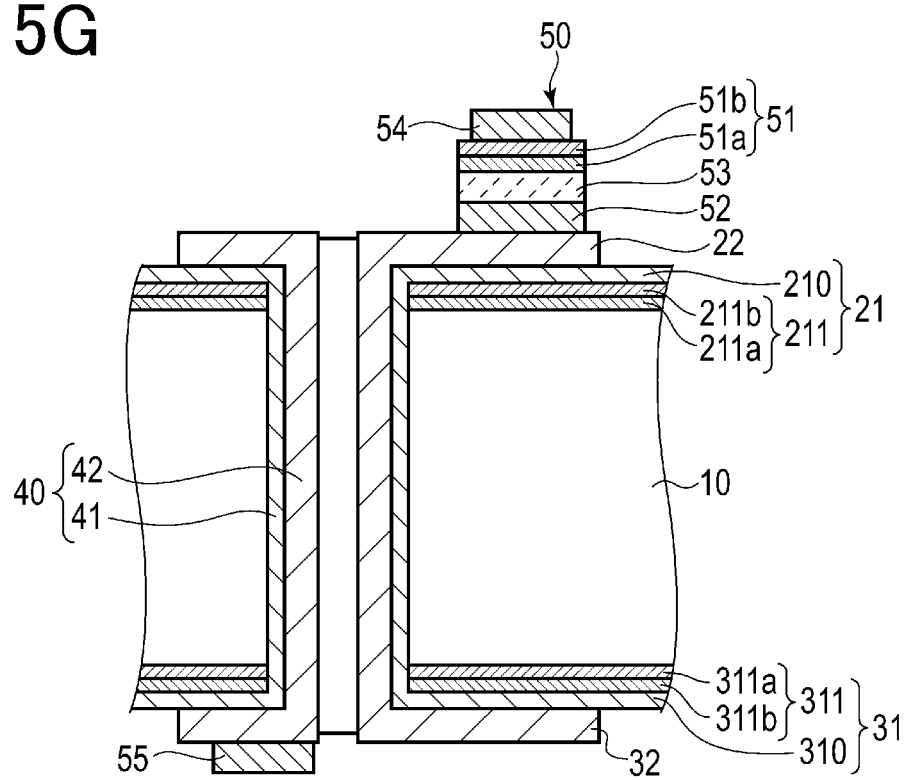
FIG. 15G is a schematic cross-sectional view illustrating the example of the method for manufacturing the core substrate illustrated in FIGS. 5 and 6.

Next, the resist layers RE3 and RE4 are stripped by using a resist stripping liquid such as an alkaline solution as illustrated in FIG. 15G. In this manner, the capacitor 50 is obtained.

Figure 15H:
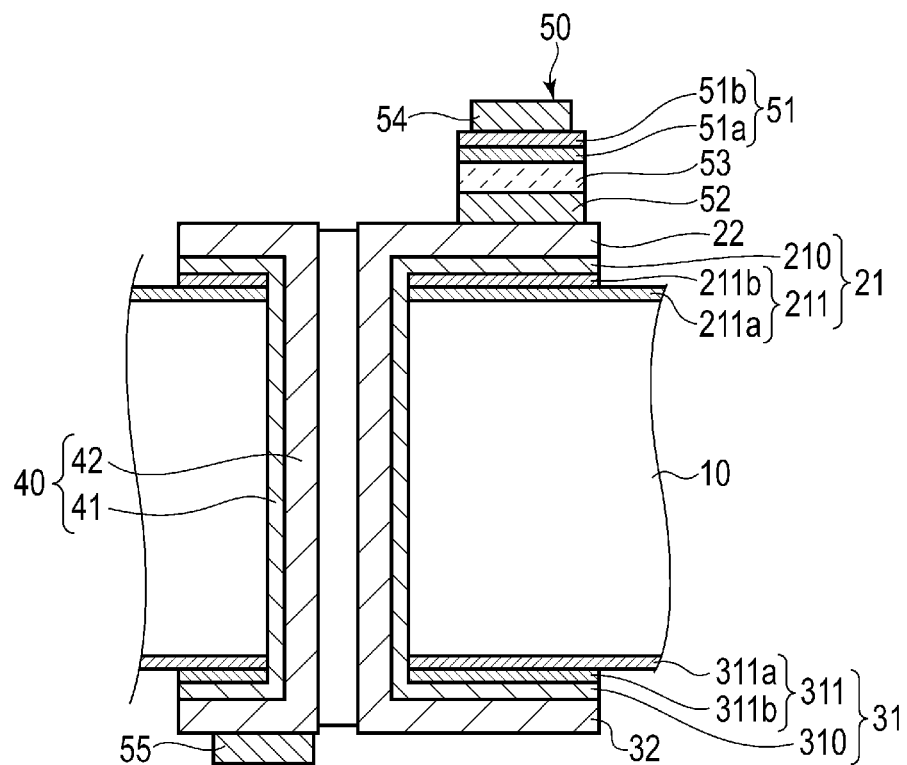
FIG. 15H is a schematic cross-sectional view illustrating the example of the method for manufacturing the core substrate illustrated in FIGS. 5 and 6.

Next, by using an acid such as a first etching agent, portions of the first nickel plating layer 210 and the first copper layer 211b not covered with the first copper plating layer 22 are etched, and portions of the second nickel plating layer 310 and the second copper layer 311b not covered with the second copper plating layer 32 are etched as illustrated in FIG. 15H.

The etching by the acid is performed with the end surface of the capacitor 50 exposed to the outside. The etching by the acid is performed under the same conditions as those for the etching by using the first etching agent described above with reference to FIG. 13F.

Figure 15I:
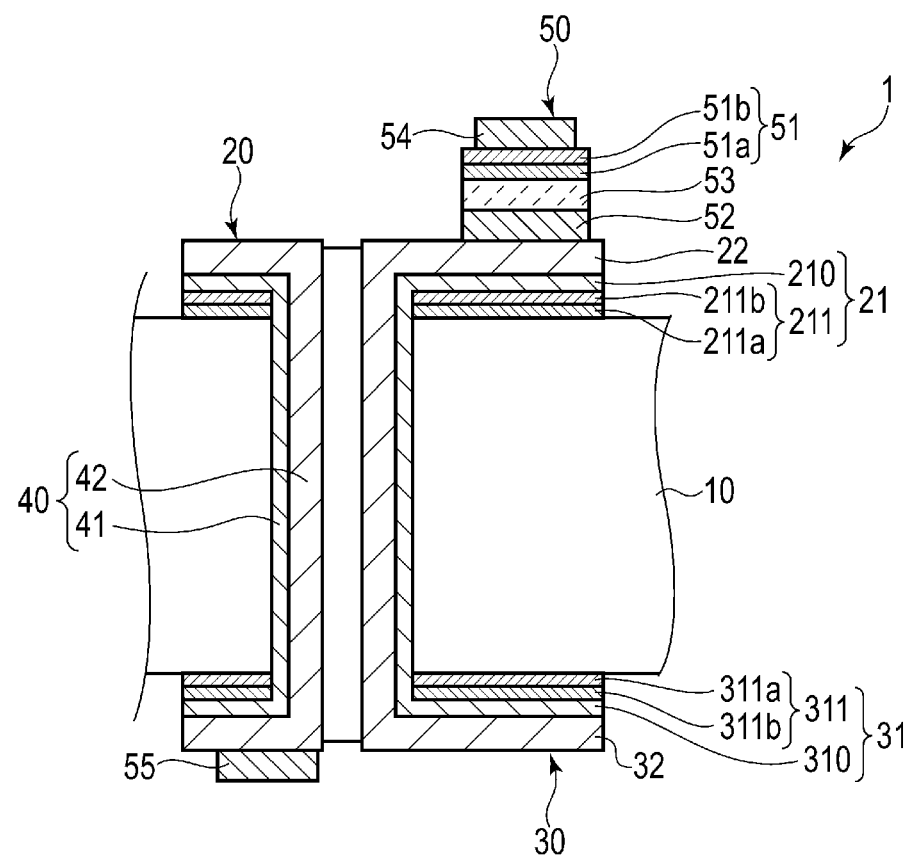
FIG. 15I is a schematic cross-sectional view illustrating the example of the method for manufacturing the core substrate illustrated in FIGS. 5 and 6.

Next, by using a weak alkaline solution as the second etching agent, a portion of the first titanium layer 211a not covered with the first copper plating layer 22 is etched and a portion of the second titanium layer 311a not covered with the second copper plating layer 32 is etched as illustrated in FIG. 15I. In this manner, the conductor patterns 20 and 30 are obtained.

The etching by the weak alkaline solution is performed with the end surface of the capacitor 50 exposed externally. The etching by the weak alkaline solution is performed under the same conditions as those for the etching by using the second etching solution described above with reference to FIG. 13F.

In this manner, the core substrate 1 including the capacitor 50 is obtained.

The thus obtained core substrate 1 is less prone to cracking as compared to a core substrate on which a nickel plating layer with a phosphorus content is 6 mass % or more is provided. In addition, according to this manufacturing method, after the formation of the capacitor 50, the seed layers 21 and 31 are etched. Even though the seed layers 21 and 31 are not masked with resist layers at the time of the etching, the capacitor 50 is less damaged at the end surface to achieve favorable capacitor performance.

Figure 16:
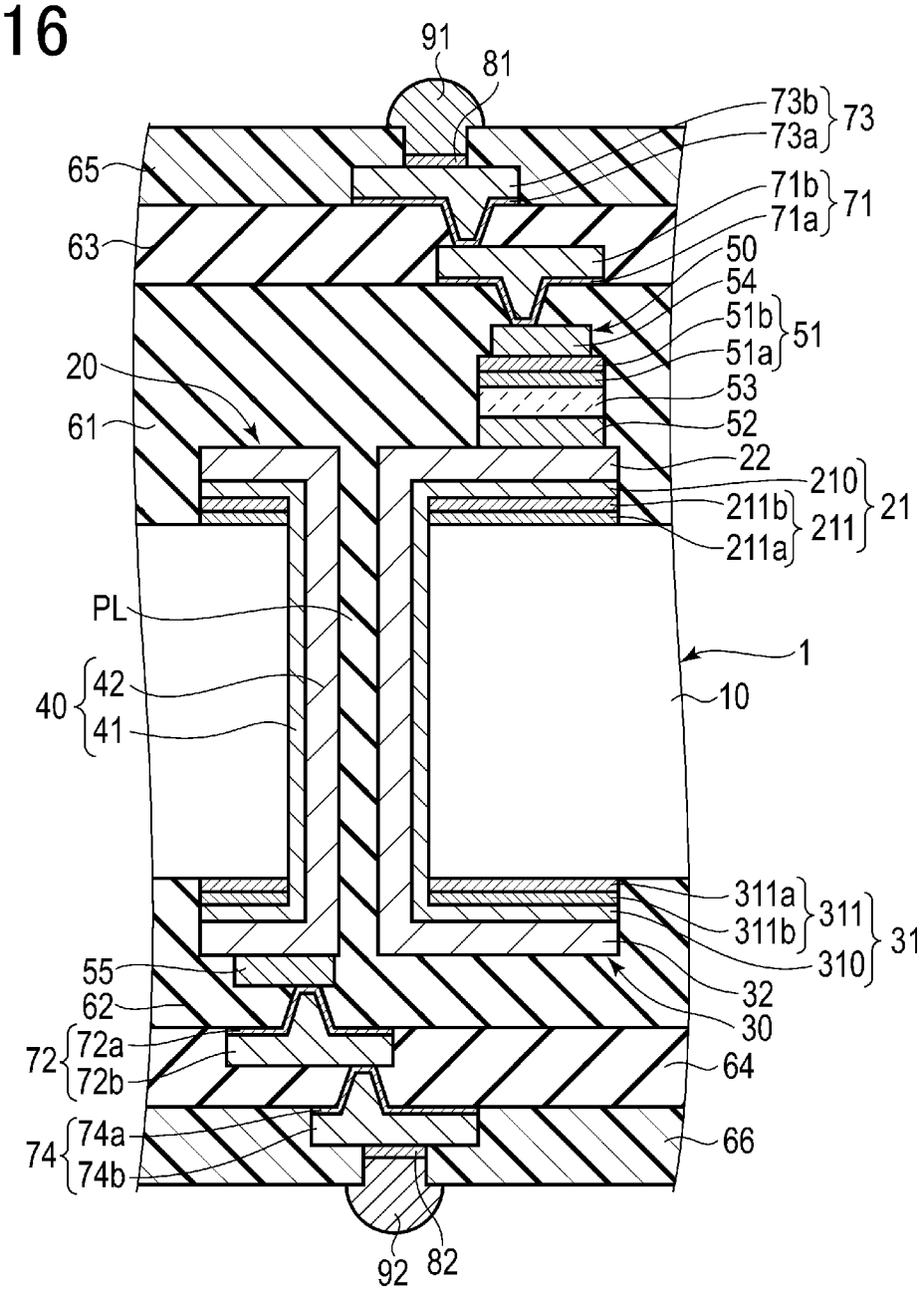
FIG. 16 is a schematic cross-sectional view illustrating an example of a method for manufacturing the multi-layer wring substrate illustrated in FIG. 10.

Next, a method for manufacturing the multi-layer wiring substrate illustrated in FIG. 10 will be described. FIG. 16 is a cross-sectional drawing schematically illustrating an example of a method for manufacturing the multi-layer wiring substrate illustrated in FIG. 10.

First, the structure illustrated in FIGS. 5 and 6 is obtained by the method described above with reference to FIGS. 15A to 15I. Next, the structure illustrated in FIG. 16 is obtained by the same method as described above with reference to FIGS. 14A to 14I except that the structure illustrated in FIGS. 5 and 6 is used instead of the structure illustrated in FIGS. 1 and 2. The multi-layer wiring substrate 1000 illustrated in FIG. 10 is obtained in this manner, for example.

The core substrate 1 according to each of the embodiments described above is less prone to cracking as compared to a core substrate including a nickel plating layers with a phosphorus content of 6 mass % or more. The core substrate 1 is also excellent in electrical characteristics.

Therefore, the multi-layer wiring substrate 1000 including the core substrate 1, the semiconductor package 3000, and the semiconductor module 5000 are excellent in durability and electrical characteristics.

The present invention is not limited to the embodiments and modification examples described above. Besides, various modification examples can be carried out without deviating from the gist of the present invention.

EXAMPLES

Hereinafter, examples of the present invention will be described.

First Example

The multi-layer wiring substrate 1000 illustrated in FIG. 9 was manufactured by the method described below.

First, the glass plate 10 (OA-10G manufactured by Nippon Electric Glass Co., Ltd.) including the through hole TH was prepared as illustrated in FIG. 13A. The thickness of the glass plate 10 was 500 μm. The roughness of the surface of the glass plate 10 measured by a contactless interference microscope was 0.5 nm.

The diameter of the through hole TH formed in the glass plate 10 was 80 μm on the first main surface of the glass plate 10 and was 60 μm on the second main surface of the glass plate 10.

Next, titanium was deposited by sputtering on the first main surface of the glass plate 10 to form the first titanium layer 211a. Then, the same method was used to form the second titanium layer 311a on the second main surface of the glass plate 10. The thicknesses of the titanium layers 211a and 311a were 50 nm. Then, copper was deposited by sputtering on the first titanium layer 211a and the second titanium layer 311a to form the first copper layer 211b and the second copper layer 311b, respectively. The thicknesses of the copper layers 211b and 311b were 300 nm.

Next, by electroless plating, the first nickel plating layer 210 and the second nickel plating layer 310 were formed respectively on the first copper layer 211b and the second copper layer 311b, and the third nickel plating layer was formed on the side wall of the through hole TH as illustrated in FIG. 13B.

The thicknesses of the first to third nickel plating layers measured by the method described above were 0.1 μm. The phosphorus contents of the first to third nickel plating layers measured by the method described above were 1 mass %.

The electroless nickel plating liquid had a nickel sulfate density of 20 g/L, a nickel hypophosphite density of 15 g/L, a sodium citrate density of 30 g/L, and an ammonium chloride density of 30 g/L. Hereinafter, the electroless nickel plating liquid will be called plating liquid A.

In the electroless plating process, the pH of the electroless nickel plating liquid was 9.0, the temperature of the electroless nickel plating liquid was 50° C., and the plating process time was five minutes.

Next, a light-sensitive dry film resist was laminated by using a roll lamination device on the first nickel plating layer 210 to form the first resist layer RE1. The same method was used to form the second resist layer RE2 on the second nickel plating layer 310.

Next, a portion of the first resist layer RE1 was removed by photolithography to provide the first opening portion OP1 as illustrated in FIG. 13C. The same method was used to remove a portion of the second resist layer RE2 to provide the second opening portion OP2.

Next, by electrolytic plating, the first copper plating layer 22 and the second copper plating layer 32 were formed respectively on a portion of the first nickel plating layer 210 not covered with the first resist layer RE1 and a portion of the second nickel plating layer 310 not covered with the second resist layer RE2, and the third copper plating layer 42 was formed on the third nickel plating layer. The thicknesses of the first to third copper plating layers were 10 μm.

Next, the resist layers RE1 and RE2 were stripped by using an alkaline solution as illustrated in FIG. 13E.

Next, a mixed solution of sulfuric acid and hydrogen peroxide as a first etching agent was used to etch portions of the first nickel plating layer 210 and the first copper layer 211b not covered with the first copper plating layer 22 and portions of the second nickel plating layer 310 and the second copper layer 311b not covered with the second copper plating layer 32 as illustrated in FIG. 13F.

The pH of the mixed solution of sulfuric acid and hydrogen peroxide was 1 and the temperature of the mixed solution was 25° C.

Next, a mixed solution of aqueous hydrogen peroxide and ammonia water as a second etching agent was used to etch a portion of the first titanium layer 211a not covered with the first copper plating layer 22 and a portion of the second titanium layer 311a not covered with the second copper plating layer 32.

The pH of the mixed solution was 9 and the temperature of the mixed solution was 25° C.

In the manner as described above, the core substrate 1 was obtained. In the core substrate 1, the roughness of the portion of the surface of the glass plate 10 exposed by etching the seed layers 21 and 31, measured by using a contactless interference microscope, was 0.5 nm.

Next, an epoxy resin was laminated by using a vacuum laminate method to form the first insulation layer 61 and the second insulation layer 62 to cover the first and second main surfaces of the core substrate 1, and the through hole TH was filled with the resin to form the plug PL as illustrated in FIG. 14A. The thickness of the epoxy resin was 25 μm.

Next, the first insulation layer 61 was irradiated with a laser beam using a UV-YAG laser to form the third opening portion OP3 as illustrated in FIG. 14B. The same method was used to form the fourth opening portion OP4 in the second insulation layer 62. Each of the opening portions OP3 and OP4 was formed in a columnar shape with a diameter of 60 μm.

Then, the insulation layers 61 and 62 were subjected to de-smearing treatment to remove smears and roughen the surfaces of the insulation layers 61 and 62.

Next, as illustrated in FIG. 14C, the seed layer 71a was formed by electroless plating on the first insulation layer 61 and a portion of the first copper plating layer 22 not covered with the first insulation layer 61. The same method was used to form the seed layer 72a on the second insulation layer 62 and a portion of the second copper plating layer 32 not covered with the second insulation layer 62. The thicknesses of the seed layers 71a and 72a were 1 μm.

Next, a light-sensitive dry film resist was laminated by using a roll lamination device to form the third resist layer RE3 on the seed layer 71a. The same method was used to form the fourth resist layer RE4 on the seed layer 72a. The thickness of the light-sensitive dry film resist was 25 μm.

Next, a portion of the third resist layer RE3 was removed by photolithography to provide the fifth opening portion OP5 as illustrated in FIG. 14D. The same method was used to remove a portion of the fourth resist layer RE4 to provide the sixth opening portion OP6.

Next, by electrolytic plating, the copper plating layer 71b was formed on a portion of the seed layer 71a not covered with the third resist layer RE3, and the copper plating layer 72b was formed on a portion of the seed layer 72a not covered with the fourth resist layer RE4 as illustrated in FIG. 14E. The thicknesses of the copper plating layer 71b and 72b were 10 μm.

Next, the resist layers RE3 and RE4 were stripped by using an alkaline solution.

Then, a portion of the seed layer 71a not covered with the copper plating layer 71b and a portion of the seed layer 72a not covered with the copper plating layer 72b were etched as illustrated in FIG. 14F. In this manner, the wiring layers 71 and 72 were obtained.

Next, the steps described above with reference to FIGS. 14A to 14F were repeated to form the third wiring layer 73 on a portion of the first wiring layer 71 and on a portion of the third insulation layer 63 as illustrated in FIG. 14G. In the same manner, the fourth wiring layer 74 was formed on a portion of the second wiring layer 72 and on a portion of the fourth insulation layer 64.

Next, a light-sensitive solder resist was laminated by using a lamination device to form the fifth insulation layer 65 on the third insulation layer 63 and the third wiring layer 73. The same method was used to form the sixth insulation layer 66 on the fourth insulation layer 64 and the fourth wiring layer 74. The thickness of the light-sensitive solder resist was 25 μm.

Next, a portion of the fifth insulation layer 65 was removed by photolithography to form the seventh opening portion OP7 as illustrated in FIG. 14H. The seventh opening portion OP7 had a columnar shape with a diameter of 500 μm. The same method was used to remove a portion of the sixth insulation layer 66 to form the eighth opening portion OP8. The eighth opening portion OP8 had a columnar shape with a diameter of 100 μm.

Next, by electroless plating, the first surface treatment layer 81 was formed on a portion of the third wiring layer 73 not covered with the fifth insulation layer 65, and the second surface treatment layer 82 was formed on a portion of the fourth wiring layer 74 not covered with the sixth insulation layer 66 as illustrated in FIG. 14I. The thicknesses of the surface treatment layers 81 and 82 were 0.05 μm. The electroless plating liquid was an electroless Ni—P/Au plating liquid.

Next, the first solder layer 91 was formed on the first surface treatment layer 81 by a solder ball transfer mounting method. The average diameter of the solder balls included in the first solder layer 91 was 550 μm. The same method was used to form the second solder layer 92 on the second surface treatment layer 82. The average diameter of the solder balls included in the second solder layer 92 was 90 μm. The solder was Sn—Ag—Cu solder.

In this manner, the multi-layer wiring substrate 1000 illustrated in FIG. 9 was obtained.

Second Example

A multi-layer wiring substrate was obtained by the same method as described above in relation to the first example except that the thickness of the glass plate 10 was changed from 500 μm to 300 μm, the bath temperature of the electroless nickel plating was changed from 50° C. to 45° C., and the electroless nickel plating process time was changed from five minutes to 20 minutes.

In the multi-layer wiring substrate, the phosphorus contents of the first to third nickel plating layers were 3 mass %. The thicknesses of the first to third nickel plating layers were 0.3 μm.

Third Example

A multi-layer wiring substrate was obtained in the same manner as described above in relation to the second example except that the bath temperature of the electroless nickel plating was changed from 45° C. to 40° C. and the electroless nickel plating process time was changed from 20 minutes to 30 minutes.

In the multi-layer wiring substrate, the phosphorus contents of the first to third nickel plating layers were 5 mass %. The thicknesses of the first to third nickel plating layers were 0.3 μm.

Fourth Example

A multi-layer wiring substrate was obtained by the same method as described above in relation to the second example except that the electroless nickel plating process time was changed from 20 minutes to 35 minutes.

In the multi-layer wiring substrate, the phosphorus contents of the first to third nickel plating layers were 3 mass %. The thicknesses of the first to third nickel plating layers were 0.4 μm.

Fifth Example

A multi-layer wiring substrate was obtained by the same method as described above in relation to the second example except that the bath temperature of the electroless nickel plating was changed from 45° C. to 40° C. and the electroless nickel plating process time was changed from 20 minutes to 40 minutes.

In the multi-layer wiring substrate, the phosphorus contents of the first to third nickel plating layers were 5 mass %. In the multi-layer wiring substrate, the thicknesses of the first to third nickel plating layers were 0.4 μm.

Sixth Example

First, a core substrate in which the copper plating layers 22 and 32 are patterned and the seed layers 21 and 31 are not patterned as illustrated in FIG. 13E was obtained by the same method as described above in relation to the first example except that the thickness of the glass plate 10 was changed from 500 μm to 300 μm, a plating liquid B was used instead of the plating liquid A as the electroless nickel plating liquid, the bath temperature of the electroless nickel plating was changed from 50° C. to 90° C., and the pH of the electroless nickel plating liquid was changed from 9.0 to 4.5.

The plating liquid B had a nickel sulfate density of 20 g/L, a lactic acid density of 25 g/L, a sodium hypophosphite density of 25 g/L, a lead density of 1 mg/L, and a sulfur compound density of 1 mg/L.

Next, the core substrate 1 was obtained by etching portions of the first nickel plating layer 210, the first copper layer 211b, and the first titanium layer 211a not covered with the first copper plating layer 22 and portions of the second nickel plating layer 310, the second copper layer 311b, and the second titanium layer 311a not covered with the second copper plating layer 32 as illustrated in FIG. 13F by using an electroless nickel plating stripping agent containing sodium hydroxide as a first etching agent.

In the etching, the pH of the electroless nickel plating stripping agent containing sodium hydroxide was 13 and the temperature of the agent was 80° C.

A multi-layer wiring substrate was obtained by the same method as described above in relation to the first example except that the core substrate 1 was used.

In the multi-layer wiring substrate, the phosphorus contents of the first to third nickel plating layers were 6 mass %. The thicknesses of the first to third nickel plating layers were 0.1 μm.

Seventh Example

A core substrate in which the copper plating layers 22 and 32 are patterned and the seed layers 21 and 31 are not patterned illustrated in FIG. 13E was obtained by the same manner as described above in relation to the sixth example.

Next, a mixed solution of sulfuric acid and hydrogen peroxide as a first etching agent was used to etch portions of the first nickel plating layer 210 and the first copper layer 211b not covered with the first copper plating layer 22 and portions of the second nickel plating layer 310 and the second copper layer 311b not covered with the second copper plating layer 32.

In the etching, the pH of the mixed solution of sulfuric acid and hydrogen peroxide was 1 and the temperature of the mixed solution was 25° C.

In the etching, portions of the first and second nickel plating layers were not sufficiently etched. Specifically, portions of the first nickel plating layer 210 and the first copper layer 211b not covered with the first copper plating layer 22 and portions of the second nickel plating layer 310 and the second copper layer 311b not covered with the second copper plating layer 32 were not removed.

Next, the core substrate 1 was obtained by etching a portion of the first titanium layer 211a not covered with the first copper plating layer 22 and a portion of the second titanium layer 311a not covered with the second copper plating layer 32 by using a mixed solution of aqueous hydrogen peroxide and ammonia water as a second etching agent.

A multi-layer wiring substrate was obtained by the same method as described above in relation to the first example except that the core substrate 1 was used.

In the multi-layer wiring substrate, the phosphorus contents of the first to third nickel plating layers were 6 mass %. The thicknesses of the first to third nickel plating layers were 0.1 μm.

Eighth Example

First, a core substrate in which the copper plating layers 22 and 32 are patterned and the seed layers 21 and 31 are not patterned as illustrated in FIG. 13E was obtained by the same method as described above in relation to the first example except that the thickness of the glass plate 10 was changed from 500 μm to 300 μm.

Next, the core substrate 1 was obtained by etching portions of the first nickel plating layer 210, the first copper layer 211b, and the first titanium layer 211a not covered with the first copper plating layer 22 and portions of the second nickel plating layer 310, the second copper layer 311b, and the second titanium layer 311a not covered with the second copper plating layer 32 by using an electroless nickel plating stripping agent containing sodium hydroxide as a first etching agent.

In the etching, the pH of the electroless nickel plating stripping agent containing sodium hydroxide was 13 and the temperature of the agent was 80° C.

In the etching, portions of the first and second nickel plating layers were not sufficiently etched. Specifically, portions of the first nickel plating layer 210, the first copper layer 211b, and the first titanium layer 211a not covered with the first copper plating layer 22 and portions of the second nickel plating layer 310, the second copper layer 311b, and the second titanium layer 311a not covered with the second copper plating layer 32 were not removed.

A multi-layer wiring substrate was obtained by the same method as described above in relation to the first example except that the core substrate 1 was used.

In the multi-layer wiring substrate, the phosphorus contents of the first to third nickel plating layers were 1 mass %. The thicknesses of the first to third nickel plating layers were 0.1 μm.

Ninth Example

The multi-layer wiring substrate 1000 illustrated in FIG. 10 was manufactured by the method described below.

First, a core substrate in which the copper plating layers 22 and 32 are patterned and the seed layers 21 and 31 are not patterned as illustrated in FIG. 13E was obtained by the same method as described above in relation to the first example.

Next, titanium was deposited by sputtering on the first copper plating layer 22 and a portion of the first nickel plating layer 210 not covered with the first copper plating layer 22 to form the second conductive layer 52' as illustrated in FIG. 15A. The thicknesses of the second conductive layer 52' was 0.05 μm.

Then, the same method was used to deposit aluminum oxide on the second conductive layer 52' to form the dielectric layer 53. The thicknesses of the dielectric layer 53 was 0.3 μm.

Then, the same method was used to form the third titanium layer 51a on the dielectric layer 53. The thicknesses of the third titanium layer 51a was 0.05 μm. Then, the same method was used to form the third copper layer 51b on the third titanium layer 51a to obtain the first conductive layer 51'. The thickness of the third copper layer 51b was 0.3 μm.

Next, a light-sensitive dry film resist was laminated by using a roll lamination device on the first conductive layer 51' to form the first resist layer RE1. The same method was used to form the second resist layer RE2 on the second copper plating layer 32 and a portion of the second nickel plating layer 310 not covered with the second copper plating layer 32. The thickness of the light-sensitive dry film resist was 25 μm.

Next, a portion of the first resist layer RE1 was removed by photolithography to provide the first opening portion OP1 as illustrated in FIG. 15B. The same method was used to remove a portion of the second resist layer RE2 to provide the second opening portion OP2.

Next, the fourth copper plating layer 54 was formed by electrolytic plating on a portion of the first conductive layer 51' not covered with the first resist layer RE1 as illustrated in FIG. 15C. The same method was used to form the fifth copper plating layer 55 on a portion of the second copper plating layer 32 not covered with the second resist layer RE2.

Next, the resist layers RE1 and RE2 were stripped by using an alkaline solution as illustrated in FIG. 15D.

Next, a light-sensitive dry film resist was laminated by using a roll lamination device to form the third resist layer RE3 to cover portions of the fourth copper plating layer 54 and the third copper layer 51b as illustrated in FIG. 15E. The same method was used to form the fourth resist layer RE4 to cover the second copper plating layer 32 and a portion of the second nickel plating layer 310 not covered with the second copper plating layer 32. The thickness of the light-sensitive dry film resist was 25 μm.

Next, portions of the first conductive layer 51', the dielectric layer 53, and the second conductive layer 52' not covered with the third resist layer RE3 were sequentially etched by dry etching as illustrated in FIG. 15F.

Next, the resist layers RE3 and RE4 were stripped by using an alkaline solution as illustrated in FIG. 15G. In this manner, the capacitor 50 was obtained.

Next, a mixed solution of sulfuric acid and hydrogen peroxide as a first etching agent was used to etch portions of the first nickel plating layer 210 and the first copper layer 211b not covered with the first copper plating layer 22 and portions of the second nickel plating layer 310 and the second copper layer 311b not covered with the second copper plating layer 32 as illustrated in FIG. 15H.

The etching by the acid was performed with the end surface of the capacitor 50 exposed externally. The etching by the acid was performed under the same conditions as those for the etching by using the first etching agent described above in relation to the first example.

Next, a mixed solution of ammonia water and aqueous hydrogen peroxide was used as a second etching agent to etch a portion of the first titanium layer 211a not covered with the first copper plating layer 22 and a portion of the second titanium layer 311a not covered with the second copper plating layer 32 as illustrated in FIG. 15I. In this manner, the conductor patterns 20 and 30 were obtained.

The etching by the mixed solution of ammonia water and aqueous hydrogen peroxide was performed with the end surface of the capacitor 50 exposed externally. The etching by the mixed solution of ammonia water and aqueous hydrogen peroxide was performed under the same conditions as those for the etching by using the second etching agent described above in relation to the first example.

In this manner, the core substrate 1 including the capacitor 50 was obtained.

Next, the structure illustrated in FIG. 16 was obtained by the same method as described above with reference to FIGS. 14A to 14I except that the structure illustrated in FIGS. 5 and 6 was used instead of the structure illustrated in FIGS. 1 and 2.

In the multi-layer wiring substrate, the phosphorus contents of the first to third nickel plating layers were 1 mass %. The thicknesses of the first to third nickel plating layers were 0.1 μm.

Tenth Example

A multi-layer wiring substrate was obtained by the same method as described above in relation to the ninth example except that the thickness of the glass plate was changed from 500 μm to 300 μm, the bath temperature of the electroless nickel plating was changed from 50° C. to 45° C., and the electroless nickel plating process time was changed from five minutes to 20 minutes.

In the multi-layer wiring substrate, the phosphorus contents of the first to third nickel plating layers were 3 mass %. In the multi-layer wiring substrate, the thicknesses of the first to third nickel plating layers were 0.3 μm.

Eleventh Example

A multi-layer wiring substrate was obtained by the same method as described above in relation to the tenth example except that the bath temperature of the electroless nickel plating was changed from 45° C. to 40° C. and the electroless nickel plating process time was changed from 20 to 30 minutes.

In the multi-layer wiring substrate, the phosphorus contents of the first to third nickel plating layers were 5 mass %. In the multi-layer wiring substrate, the thicknesses of the first to third nickel plating layers were 0.3 μm.

<Evaluations>

The multi-layer wiring substrates manufactured as the first to eight examples were evaluated for the susceptibility to cracking, adhesion, and formation of conductor pattern by the methods described below. The multi-layer wiring substrates manufactured as the ninth to eleventh examples were also evaluated for formation of capacitor in addition to the foregoing characteristics.

[Susceptibility to Cracking]

The core substrates obtained by the methods described above in relation to the first to eleventh examples were visually checked for cracking. Table 1 shows the number of the core substrates with cracking out of the ten core substrates obtained by the foregoing methods.

[Adhesion]

Each of the core substrates obtained by the methods described above in relation to the first to eleventh examples was subjected to a cross-cut tape test prescribed in JIS K 5400: 1990 "Testing methods for paints".

Specifically, first, eleven slits were made at equal intervals in the first main surface of the core substrate by using a cutter knife. Then, the core substrate was turned 90° and eleven slits were further made to form 100 squares on the first main surface of the core substrate. The depths of these slits reached the glass plate 10. One side of each of the square was 1 mm long. An adhesive tape was attached and press-fitted to the squares on the core substrate. Then, the adhesion tape was peeled from the main surface of the core substrate. The number of peeled squares was checked visually.

Table 1 shows the number of the squares peeled from the glass plate 100 squares formed on the core substrate.

[Formation of Conductor Pattern]

The core substrates obtained by the methods described above in relation to the first to eleven examples were visually checked for whether desired conductor patterns were formed. The core substrates with the desired conductor patterns formed were evaluated as "OK". The core substrates without the desired conductor patterns formed due to insufficient etching of the seed layers were evaluated as "Poor".

[Formation of Capacitor]

The core substrates obtained by the methods described above in relation to the ninth to eleventh examples were visually checked on whether desired capacitors were formed. The core substrates according to the ninth to eleventh examples were all OK because no side etching was found and the desired capacitors were formed.

Table 1 shows collectively the foregoing results of the first to eleventh examples.

TABLE 1

| | Nickel plating processing conditions | | | Nickel plating layer | | Etching condition | Evaluation | | | |
|---|---|---|---|---|---|---|---|---|---|---|
| | Plating liquid | Temperature (° C.) | Time (minutes) | Phosphorus content (mass %) | Thickness (μm) | First etching agent | Susceptibility to cracking (number of cracked substrates/10) | Adhesion (number of peeled squares/100) | Formation of conductor pattern | Formation of capacitor |
| First example | A | 50 | 5 | 1 | 0.1 | Acidic | 0/10 | 0/100 | OK | — |
| Second example | A | 45 | 20 | 3 | 0.3 | Acidic | 0/10 | 0/100 | OK | — |
| Third example | A | 40 | 30 | 5 | 0.3 | Acidic | 0/10 | 0/100 | OK | — |
| Fourth example | A | 45 | 35 | 3 | 0.4 | Acidic | 0/10 | 10/100 | OK | — |
| Fifth example | A | 40 | 40 | 5 | 0.4 | Acidic | 0/10 | 12/100 | OK | — |
| Sixth example | B | 90 | 5 | 6 | 0.1 | Alkaline | 9/10 | 0/100 | OK | — |
| Seventh example | B | 90 | 5 | 6 | 0.1 | Acidic | 0/10 | 0/100 | Poor | — |
| Eighth example | A | 50 | 5 | 1 | 0.1 | Alkaline | 0/10 | 0/100 | Poor | — |
| Ninth example | A | 50 | 5 | 1 | 0.1 | Acidic | 0/10 | 0/100 | OK | OK |
| Tenth example | A | 45 | 20 | 3 | 0.3 | Acidic | 0/10 | 0/100 | OK | OK |
| Eleventh example | A | 40 | 30 | 5 | 0.3 | Acidic | 0/10 | 0/100 | OK | OK |

As shown in Table 1, the core substrates including the first to third nickel plating layers with a phosphorus content of 5 mass % or less suffered no cracking but had the conductor patterns 20 and 30 of the designed shapes. Even in the case of including the capacitor 50, the core substrates including the first to third nickel plating layers with a phosphorus content of 5 mass % or less had no side etching on the end surface of the capacitor 50.

Further, the core substrates including the first to third nickel plating layers with a phosphorus content of 5 mass % or less and a thickness of 0.3 μm or less were excellent in the adhesion between the glass plate 10 and the first nickel plating layer 210 and the adhesion between the glass plate 10 and the second nickel plating layer 310.

In contrast to this, the core substrates including the first to third nickel plating layers with a phosphorus content of 6 mass % or more suffered cracking or had insufficient formation of conductor patterns.

What is claimed is:

1. A core substrate comprising:
a glass plate;
a first conductor pattern that is provided on a first main surface of the glass plate; and
a second conductor pattern that is provided on a second main surface of the glass plate, wherein
the first conductor pattern includes:
a first nickel plating layer that is provided on the first main surface of the glass plate and has a phosphorus content of 5 mass % or less, and
a first copper plating layer that is provided on the first nickel plating layer, wherein
the second conductor pattern includes:
a second nickel plating layer that is provided on the second main surface of the glass plate and has a phosphorus content of 5 mass % or less; and
a second copper plating layer that is provided on the second nickel plating layer, and wherein
the glass plate has a through hole,
the core substrate further includes a conductor layer that covers a side wall of the through hole and electrically connects the first and second conductor patterns, and
the conductor layer includes:
a third nickel plating layer that is provided on the side wall and has a phosphorus content of 5 mass % or less; and
a third copper plating layer that is provided on the third nickel plating layer.

2. The core substrate of claim 1, further comprising:
an electrode that is provided on at least a portion of the first conductor pattern; and
a dielectric layer that is disposed between the first conductor pattern and the electrode, wherein
the electrode, a portion of the first conductor pattern opposed to the electrode, and the dielectric layer constitute a capacitor.

3. The core substrate of claim 2, wherein the dielectric layer contains at least one of aluminum oxide, tantalum oxide, and silicon nitride.

4. The core substrate of claim 1, further comprising:
a first electrode that is provided on at least a portion of the first conductor pattern;
a second electrode that is disposed between the first electrode and the first conductor pattern; and
a dielectric layer that is disposed between the first and second electrodes, wherein
the first and second electrodes and the dielectric layer constitute a capacitor.

5. The core substrate of claim 1, wherein the thickness of the first nickel plating layer is 0.3 μm or less.

6. The core substrate of claim 1, wherein the first conductor pattern further includes: a titanium layer that is disposed between the first nickel plating layer and the glass plate; and a copper layer that is disposed between the titanium layer and the first nickel plating layer.

7. The core substrate of claim 1, wherein the third nickel plating layer is in contact with the side wall of the through hole.

8. The core substrate of claim 7, further comprising a via that is made of copper and is charged into the through hole together with the conductor layer or a plug that is made of a resin and is charged into the through hole together with the conductor layer.

9. A multi-layer wiring substrate comprising:
   the core substrate of claim 1;
   a wiring layer that is opposed to the glass plate with the first conductor pattern therebetween; and
   an insulation layer that is disposed between the first conductor pattern and the wiring layer.

10. A semiconductor package comprising:
    the core substrate of the multi-layer wiring substrate of claim 9; and
    a semiconductor chip mounted on the substrate.

11. A semiconductor module comprising:
    the semiconductor package of claim 10; and
    a mother board on which the semiconductor package is mounted.

12. A method for manufacturing a core substrate comprising:
    forming a nickel plating layer with a phosphorus content of 5 mass % or less on at least a first main surface of a glass plate by electroless plating;
    forming a copper plating layer to cover a portion of the nickel plating layer by electrolytic plating; and
    etching the other portion of the nickel plating layer by using an acid as an etching agent to form a conductor pattern including the portion of the nickel plating layer and the copper plating layer, wherein the glass plate comprises a through hole, the nickel plating layer is formed on the first main surface of the glass plate, a second main surface of the glass plate, and a side wall of the through hole, and the copper plating layer is formed to cover the nickel plating layer on a portion of the first main surface of the glass plate, a portion of the second main surface of the glass plate, and a portion on the side wall of the through hole.

13. The method for manufacturing a core substrate of claim 12, further comprising, prior to the etching, forming a capacitor on the copper plating layer, wherein the etching is performed with an end surface of the capacitor exposed.

14. The method for manufacturing a core substrate of claim 12, further comprising, prior to the formation of the nickel plating layer, forming a metal-containing layer on a first main surface of the glass plate by sputtering or vapor phase deposition.

15. The method for manufacturing a core substrate of claim 12, further comprising, after the etching, filling a gap in the through hole with copper or a resin.

* * * * *